(12) United States Patent
Nishimura et al.

(10) Patent No.: US 10,920,764 B2
(45) Date of Patent: Feb. 16, 2021

(54) PUMPING APPARATUS, TREATMENT SOLUTION SUPPLYING DEVICE, SUBSTRATE TREATING APPARATUS, LIQUID DRAINING METHOD, AND LIQUID REPLACING METHOD

(71) Applicant: SCREEN Holdings Co., Ltd., Kyoto (JP)

(72) Inventors: Junki Nishimura, Kyoto (JP); Hiroyuki Ogura, Kyoto (JP); Masahito Kashiyama, Kyoto (JP); Toru Momma, Kyoto (JP); Shoji Kirita, Kyoto (JP); Hidetoshi Sagawa, Kyoto (JP); Shogo Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/045,884

(22) Filed: Jul. 26, 2018

(65) Prior Publication Data

US 2019/0063415 A1    Feb. 28, 2019

(30) Foreign Application Priority Data

Aug. 31, 2017   (JP) .............................. JP2017-167534

(51) Int. Cl.
*F04B 43/02*    (2006.01)
*F04F 1/06*     (2006.01)
(Continued)

(52) U.S. Cl.
CPC .............. *F04B 43/02* (2013.01); *F04B 23/02* (2013.01); *F04B 23/04* (2013.01); *F04B 23/06* (2013.01);
(Continued)

(58) Field of Classification Search
CPC .......... F04B 43/02; F04B 43/08; F04B 23/06; F04B 53/16; F04B 53/20; F04B 7/0076;
(Continued)

(56) References Cited

U.S. PATENT DOCUMENTS 10,507,484 B2 * 12/2019 Kashiyama ............. B05B 15/40
10,790,165 B2 *  9/2020 Kashiyama ........... F04B 43/025
(Continued)

FOREIGN PATENT DOCUMENTS

JP   2006-272661 A   10/2006
JP   2009-049228 A    3/2009
(Continued)

OTHER PUBLICATIONS

Office Action dated Dec. 18, 2019 for corresponding Korean Patent Application No. 10-2018-0087823.
(Continued)

*Primary Examiner* — Nathan C Zollinger
(74) *Attorney, Agent, or Firm* — Ostrolenk Faber LLP

(57) ABSTRACT

A chamber has at least three openings, or a first opening, a second opening, and a third opening formed therein that are in communication with a reservoir. The second opening is higher in level than the first opening. The third opening is used for discharging a liquid within the reservoir by introducing gas through at least one of the first opening and the second opening into the reservoir. Since the third opening is the lowest in level among the three openings, the liquid stored in the reservoir is able to be drained easily.

6 Claims, 13 Drawing Sheets

(51) Int. Cl.
- *F04B 43/08* (2006.01)
- *F04F 1/12* (2006.01)
- *F04B 23/02* (2006.01)
- *F04B 23/04* (2006.01)
- *F04B 49/22* (2006.01)
- *F04B 53/20* (2006.01)
- *F04B 53/16* (2006.01)
- *F04B 23/06* (2006.01)
- *F04B 7/00* (2006.01)
- *H01L 21/67* (2006.01)

(52) U.S. Cl.
CPC .............. *F04B 43/08* (2013.01); *F04B 49/22* (2013.01); *F04B 53/16* (2013.01); *F04B 53/20* (2013.01); *F04F 1/06* (2013.01); *F04F 1/12* (2013.01); *H01L 21/67017* (2013.01); *F04B 7/0076* (2013.01)

(58) Field of Classification Search
CPC .......... F04B 43/10; F04B 23/10; F04B 23/04; F04B 23/02; F04B 49/22; F04F 1/12; F04F 1/06; H01L 21/67023; H01L 21/67017
See application file for complete search history.

(56) References Cited

U.S. PATENT DOCUMENTS

| | | | |
|---|---|---|---|
| 2001/0025890 A1 | 10/2001 | Fujimoto et al. | 239/1 |
| 2002/0131875 A1* | 9/2002 | Yajima | B01D 19/0031 417/313 |
| 2005/0238504 A1* | 10/2005 | Yajima | F04B 43/0081 417/394 |
| 2006/0268078 A1 | 11/2006 | Kumagai | 347/85 |
| 2007/0128047 A1 | 6/2007 | Gonnella et al. | 417/2 |
| 2011/0098864 A1 | 4/2011 | Gonnella et al. | 700/282 |
| 2013/0004340 A1 | 1/2013 | Gonnella et al. | 417/53 |
| 2014/0174475 A1 | 6/2014 | Takayanagi et al. | 134/18 |
| 2015/0048035 A1* | 2/2015 | Liao | B01D 35/02 210/767 |
| 2015/0090340 A1 | 4/2015 | Takayanagi et al. | 137/1 |
| 2015/0092167 A1* | 4/2015 | Terashita | H01L 21/67017 355/30 |
| 2015/0300491 A1* | 10/2015 | Teshima | F04B 43/0054 92/48 |
| 2017/0232460 A1* | 8/2017 | Kashiyama | H01L 21/6715 239/590 |

FOREIGN PATENT DOCUMENTS

| | | |
|---|---|---|
| JP | 2013-100825 A | 5/2013 |
| JP | 2015-072985 A | 4/2015 |
| JP | 2017-144372 A | 8/2017 |
| KR | 10-2001-0090572 A | 10/2001 |
| KR | 10-1517303 B1 | 5/2015 |
| KR | 10-2016-0047997 A | 5/2016 |
| KR | 10-2016-0052340 A | 5/2016 |

OTHER PUBLICATIONS

Notice of Allowance dated Jun. 22, 2020 for corresponding Korean Patent Application No. 10-2018-0087823.

* cited by examiner

PUMPING APPARATUS, TREATMENT SOLUTION SUPPLYING DEVICE, SUBSTRATE TREATING APPARATUS, LIQUID DRAINING METHOD, AND LIQUID REPLACING METHOD

CROSS-REFERENCE TO RELATED APPLICATIONS

This application claims priority to Japanese Patent Application No. 2017-167534 filed Aug. 31, 2017, the subject matter of which is incorporated herein by reference in entirety.

BACKGROUND OF THE INVENTION

Field of the Invention

The present invention relates to a pumping apparatus, a treatment solution supplying device, and a substrate treating apparatus used for supplying a treatment solution to substrates such as semiconductor substrates, glass substrates for liquid crystal display, glass substrates for photomask, and optical disk substrates. Moreover, the present invention relates to a liquid draining method and a liquid replacing method by these devices.

Description of the Related Art

A substrate treating apparatus includes a holding rotator that holds a substrate horizontally and rotates the held substrate, a nozzle that discharges a treatment solution to the substrate held with the holding rotator, and a pumping apparatus that feeds the treatment solution to the nozzle.

The pumping apparatus includes a chamber with a reservoir for storing the treatment solution, and a drive mechanism for displacing a movable part to change a volume of the reservoir. See, for example, Japanese Unexamined Patent Publication No. 2009-049228. The chamber includes an inlet on its lower part, and an outlet at its upper part. Specifically, the treatment solution flows through the inlet on the lower part of the chamber, and flows from the outlet at the upper part of the chamber. Such a configuration is made in order to collect air bubbles (air) present in the treatment solution at the upper part of the chamber and to drain the air bubble reliably at the time of feeding the treatment solution.

In addition, Japanese Unexamined Patent Publication No. 2013-100825 discloses multi-stage pumps with a first stage pump, a filter, and a second stage pump. The first stage pump feeds a liquid via the filter to the second stage pump. The second stage pump also includes a purge valve for discharging the liquid. The liquid discharged through the purge valve returns to the first stage pump.

SUMMARY OF INVENTION

However, the currently-used apparatus possesses the following problems. The liquid such as the treatment solution is sometimes required to be drained from the chamber of the pumping apparatus. For instance, in the case where the pumping apparatus, the treatment solution supplying device, and the substrate treating apparatus are shipped, the liquid within the chamber is drained after the chamber is cleaned. It takes a long time to perform this process of draining the liquid from the chamber since the liquid is hard to be drained. For instance, it is assumed that gas flows through the inlet on the lower part of the chamber, and liquid flows out of the outlet on the upper part of the chamber. In this case, the gas reaches the outlet on the upper part of the chamber faster than the liquid, and thus a space is formed on the upper part of the chamber. This leads to difficulty in draining the liquid from the chamber. The liquid (e.g., a photoresist solution) remaining within the chamber will become contaminants.

The present invention has been made regarding the state of the art noted above, and one object of the present invention is to provide a pumping apparatus, a treatment solution supplying device, a substrate treating apparatus, a liquid draining method, and a liquid replacing method that allow easy draining of a liquid within a chamber.

Solution to Problem

The present invention is constituted as stated below to achieve the above object. One aspect of the present invention provides a pumping apparatus for feeding a liquid. The pumping apparatus includes: a chamber with a reservoir as an interior space that stores the liquid and a movable part that contacts the reservoir, a volume of the reservoir being changed by displacement of the movable part; and a drive unit that displaces the movable part; the chamber having at least three openings, or a first opening, a second opening, and a third opening, formed therein that are in communication with the reservoir, the second opening being higher in level than the first opening, the third opening being the lowest in level among the three openings, any two of the three openings being used for normal liquid feed of sucking the liquid into the reservoir and feeding out the liquid from the reservoir by controlling circulation of the liquid in synchronization with the displacement of the movable part, and the third opening being used for discharging the liquid within the reservoir by introducing gas through at least one of the first opening and the second opening into the reservoir.

With the pumping apparatus according to the embodiment of the present invention, the chamber has at least three openings, or the first opening, the second opening, and the third opening formed therein that are in communication with the reservoir. The second opening is higher in level than the first opening. The third opening is used for discharging the liquid within the reservoir by introducing gas through at least one of the first opening and the second opening into the reservoir. Since the third opening is the lowest in level among the three openings, the liquid stored in the reservoir is able to be drained easily.

Moreover, it is preferable that the third opening of the pumping apparatus mentioned above is disposed around a bottom of the reservoir. Since the third opening is disposed around the bottom of the reservoir, the liquid stored in the reservoir is able to be drained more easily.

Moreover, in the exemplary pumping apparatus mentioned above, the first opening is disposed at a position equal in level to the third opening. This achieves reverse connection of pipes between the first opening and the third opening. That is, gas is able to be introduced through the third opening into the reservoir, and a treatment solution within the reservoir is able to be discharged through the first opening. This simplifies connection of the pipes.

Moreover, it is preferred in the pumping apparatus mentioned above that the first opening and the second opening are used for normal liquid feed of sucking the liquid into the reservoir through the first opening and feeding out the liquid within the reservoir through the second opening by controlling circulation of the liquid in synchronization with the displacement of the movable part, and that the third opening is used for discharging the liquid within the reservoir by introducing gas through the first opening into the reservoir. Accordingly, the second opening for feeding out the liquid is higher in level than the first opening for sucking the liquid. This achieves removal of air bubbles from the reservoir through the second opening during the normal liquid feed.

Moreover, it is preferred in the pumping apparatus mentioned above that the first opening and the third opening are used for normal liquid feed of sucking the liquid into the reservoir through the first opening and feeding out the liquid within the reservoir through the third opening by controlling circulation of the liquid in synchronization with the displacement of the movable part, and that the third opening is used for discharging the liquid within the reservoir by introducing gas through the first opening into the reservoir. Accordingly, the first opening for sucking the liquid is lower in level than the second opening. Moreover, the third opening for feeding out the liquid is the lowest in level among the three openings (i.e., the first, second, and third openings). Consequently, air bubbles are collected around the second opening. This achieves prevention of air bubbles from being fed out of the reservoir through the third opening during the normal liquid feed.

Moreover, in the exemplary pumping apparatus mentioned above, the second opening is used for discharging air bubbles collected at an upper portion of the reservoir. During the normal liquid feed, the liquid is sucked through the first opening lower in level than the second opening. Moreover, the liquid is fed out through the third opening lowest in level among the three openings. In this case, the air bubbles collected around the second opening is able to be discharged through the second opening.

Moreover, in the exemplary pumping apparatus mentioned above, it is preferred that the movable part is a diaphragm for contacting the reservoir, and that the drive unit displaces the diaphragm. When the movable part is the diaphragm, the liquid stored in the reservoir is able to be drained more easily.

Moreover, in the exemplary pumping apparatus mentioned above, it is preferred that the movable part is an elastic tubular member that surrounds the reservoir, and that the drive unit changes the volume of the reservoir by moving a body of the tubular member. When the movable part is the tubular member, the liquid stored in the reservoir is able to be drained more easily.

Another aspect of the present invention provides a treatment solution supplying device for supplying a treatment solution. The treatment solution supplying device includes: the pumping apparatus; and a filter provided on a flow path for filtering the treatment solution as a liquid, the flow path being connected to the first opening of the pumping apparatus; any two of the three openings being used for normal liquid feed of sucking the liquid into the reservoir and feeding out the liquid within the reservoir by controlling circulation of the liquid in synchronization with the displacement of the movable part, the two including the first opening.

With the treatment solution supplying device according to the embodiment of the present invention, the chamber has at least three openings, or the first opening, the second opening, and the third opening formed therein that are in communication with the reservoir. The second opening is higher in level than the first opening. The third opening is used for discharging the liquid within the reservoir by introducing gas through at least one of the first opening and the second opening into the reservoir. Since the third opening is the lowest in level among the three openings, the liquid stored in the reservoir is able to be drained easily.

Another aspect of the present invention provides a substrate treating apparatus for treating a substrate. The substrate treating apparatus includes: the pumping apparatus; and a filter provided on a flow path for filtering the treatment solution as a liquid, the flow path being connected to the first opening of the pumping apparatus; a nozzle provided at an end of a flow path connected to the second opening or the third opening of the pumping apparatus; any two of the three openings being used for normal liquid feed of sucking the liquid into the reservoir and feeding out the liquid within the reservoir by controlling circulation of the liquid in synchronization with the displacement of the movable part, the two including the first opening.

With the substrate treating apparatus according to the embodiment of the present invention, the chamber has at least three openings, or a first opening, a second opening, and a third opening formed therein that are in communication with the reservoir. The second opening is higher in level than the first opening. The third opening is used for discharging the liquid within the reservoir by introducing gas through at least one of the first opening and the second opening into the reservoir. Since the third opening is the lowest in level among the three openings, the liquid stored in the reservoir is able to be drained easily.

Another aspect of the present invention provides a treatment solution supplying device for supplying a treatment solution. The treatment solution supplying device includes: a filter that filters the treatment solution; a first pumping apparatus that is provided upstream of the filter and feeds the treatment solution to the filter; a second pumping apparatus that is provided downstream of the filter and sucks the treatment solution filtered through the filter and fees out the treatment solution; and a controller that controls drive of the first pumping apparatus and the second pumping apparatus and circulation of the treatment solution; the first pumping apparatus and the second pumping apparatus each includes a chamber with a reservoir as an interior space that stores a liquid containing the treatment solution and a movable part that contacts the reservoir, a volume of the reservoir being changed by displacement of the movable part; and a drive unit that displaces the movable part; the chamber having at least three openings, or a first opening, a second opening, and a third opening formed therein that are in communication with the reservoir, the second opening being higher in level than the first opening, and the third opening being the lowest in level among the three openings; the first opening of the first pumping apparatus being connected to a first flow path with a first on-off valve, the second opening of the first pumping apparatus being connected to an inlet of the filter via a second flow path with a second on-off valve, and an outlet of the filter being connected to the first opening of the second pumping apparatus via a third flow path with a third on-off valve, the second opening of the second pumping apparatus being connected to the third opening of the first pumping apparatus via a fourth flow path with a fourth on-off valve, and the third opening of the second pumping apparatus being connected to a fifth flow path with a fifth on-off valve, during normal liquid feed of supplying the treatment solution, the controller performing control of opening/closing the first to fifth on-off valves in synchronization with displacement of the movable parts of the first pumping apparatus and the second pumping apparatus, whereby the first pumping apparatus sucks the treatment solution via the first flow path and the first opening of the first pumping apparatus and feed the treatment solution to the filter via the second opening of the first pumping apparatus and the second flow path, the second pumping apparatus sucks the treatment solution filtered through the filter via the third flow path and the first opening of the second pumping apparatus, and returns a part of the sucked treatment solution to the third opening of the first pumping apparatus via the second opening of the second pumping apparatus and the fourth flow path, and feeds out a remaining part of the sucked treatment solution via the third opening of the second pumping apparatus and the fifth flow path, during discharge of the liquid from the first pumping apparatus and the second pumping apparatus, the controller performs control of operating the first on-off valve, the second on-off valve, the third on-off valve, the fourth on-off valve, and the fifth on-off valve to feed gas to the reservoir of the first pumping apparatus via the first flow path and the first opening of the first pumping apparatus, whereby the liquid in the reservoir of the first pumping apparatus is discharged to the second pumping apparatus via the third opening of the first pumping apparatus and the fourth flow path, the gas from the first pumping apparatus via the fourth flow path is fed into the reservoir of the second pumping apparatus, and the liquid in the reservoir of the second pumping apparatus is discharged via the third opening of the second pumping apparatus and the fifth flow path.

With the treatment solution supplying device of the present invention, during the normal liquid feed, the treatment solution is fed from the second opening of the second pumping apparatus through the fourth flow path to the third opening of the first pumping apparatus. During the liquid draining of the present invention, the liquid flows reversely relative to the normal liquid feed. Specifically, the treatment solution is fed from the third opening of the first pumping apparatus through the fourth flow path to the second opening of the second pumping apparatus during the liquid draining. Since the third opening of the first pumping apparatus is the lowest in level among the three openings, the liquid stored in the reservoir of the first pumping apparatus is able to be drained easily. Likewise, since the third opening of the second pumping apparatus is the lowest in level among the three openings, the liquid stored in the reservoir of the second pumping apparatus is able to be drained easily. Moreover, the liquid in the fourth flow path between the third opening of the first pumping apparatus and the second opening of the second pumping apparatus is able to be drained.

It is also preferred that, before or after discharge of the liquid from the first pumping apparatus and the second pumping apparatus, the controller of the treatment solution supplying device performs control of operating the first on-off valve, the second on-off valve, the third on-off valve, the fourth on-off valve, and the fifth on-off valve to feed gas to the reservoir of the first pumping apparatus via the first flow path and the first opening of the first pumping apparatus, to the filter from the second opening of the first pumping apparatus via the second flow path, to the reservoir of the second pumping apparatus from the filter via the third flow path and the first opening of the second pumping apparatus, and the liquid in the reservoir of the second pumping apparatus is discharged via the third opening of the second pumping apparatus and the fifth flow path.

Since the third opening of the second pumping apparatus is the lowest in level among the three openings, the liquid stored in the reservoir of the second pumping apparatus is able to be drained easily. Moreover, the liquid in the second flow path and the third flow path between the second opening of the first pumping apparatus and the first opening of the second pumping apparatus is able to be drained. Accordingly, at least the liquid in the reservoir of the first pumping apparatus, the reservoir of the second pumping apparatus, and the second to the fourth flow paths is able to be drained.

Another aspect of the present invention provides a substrate treating apparatus for treating a substrate. The substrate treating apparatus includes: the treatment solution supplying device including the first pumping apparatus and the second pumping apparatus; and a nozzle provided at an end of the fifth flow path connected to the third opening of the second pumping apparatus.

With the substrate treating apparatus of the present invention with the nozzle provided at the end of the fifth flow path, the treatment solution is fed from the second opening of the second pumping apparatus through the fourth flow path to the third opening of the first pumping apparatus during the normal liquid feed. During the liquid draining of the present invention, the liquid flows reversely relative to the normal liquid feed. Specifically, the treatment solution is fed from the third opening of the first pumping apparatus through the fourth flow path to the second opening of the second pumping apparatus during the liquid draining. Since the third opening of the first pumping apparatus is the lowest in level among the three openings, the liquid stored in the reservoir of the first pumping apparatus is able to be drained easily. Likewise, since the third opening of the second pumping apparatus is the lowest in level among the three openings, the liquid stored in the reservoir is able to be drained easily. Moreover, the liquid in the fourth flow path between the third opening of the first pumping apparatus and the second opening of the second pumping apparatus is able to be drained.

Another aspect of the present invention provides a liquid draining method performed by a treatment solution supplying device including; a chamber with a reservoir as an interior space that stores a liquid and a movable part that contacts the reservoir, a volume of the reservoir being changed by displacement of the movable part, and a drive unit that displaces the movable part, the method including: a normal liquid feed step of sucking the liquid into the reservoir and feeding the liquid from the reservoir using any two of three openings, or a first opening, a second opening higher in level than the first opening, and a third opening lowest in level among the three openings, formed in the chamber, the three openings being in communication with the reservoir in the chamber by controlling circulation of the liquid in synchronization with the displacement of the movable part; and a liquid discharging step of discharging the liquid in the reservoir through the third opening by introducing gas into the reservoir through at least one of the two openings except the third opening.

With the liquid draining method according to the embodiment of the present invention, the chamber has at least three openings, or the first opening, the second opening, and the third opening formed therein that are in communication with the reservoir. The second opening is higher in level than the first opening. The third opening is used for discharging the liquid within the reservoir by introducing gas through at least one of the first opening and the second opening into the reservoir. Since the third opening is the lowest in level among the three openings, the liquid stored in the reservoir is able to be drained easily.

Another aspect of the present invention provides a liquid replacing method performed by a treatment solution supplying device including a chamber with a reservoir as an interior space that stores a liquid and a movable part that contacts the reservoir, and a drive unit that displaces the movable part, a volume of the reservoir being changed by displacement of the movable part, the method including: a normal liquid feed step of sucking the liquid into the reservoir and feeding the liquid from the reservoir using any two of three openings, or a first opening, a second opening higher in level than the first opening, and a third opening lowest in level among the three openings, formed in the chamber, the three openings being in communication with the reservoir in the chamber by controlling circulation of the liquid in synchronization with the displacement of the movable part; a liquid discharging step of discharging the liquid in the reservoir through the third opening by introducing gas into the reservoir through at least one of the two openings except the third opening; and a second liquid charging step of charging a second liquid, different from the liquid, from any one of the three openings into the reservoir.

With the liquid replacing drawing method according to the embodiment of the present invention, the chamber has at least three opening, or the first opening, the second opening, and the third opening, formed therein that are in communication with the reservoir. The second opening is higher in level than the first opening. The third opening is used for discharging the liquid within the reservoir by introducing gas through at least one of the first opening and the second opening into the reservoir. Since the third opening is the lowest in level among the three openings, the liquid stored in the reservoir is able to be drained easily. This achieves ready replacement of the original liquid by the second liquid.

Moreover, in the liquid replacing method according to the aspect of the present invention, examples of the second liquid include a cleaning solution. This yields cleaning within the reservoir.

Advantageous Effects of Invention

The pumping apparatus, the treatment solution supplying device, the substrate treating apparatus, the liquid draining method, and the liquid replacing method according to the present invention allow easy draining of the liquid within the chamber.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Embodiment 1

Figure 1:
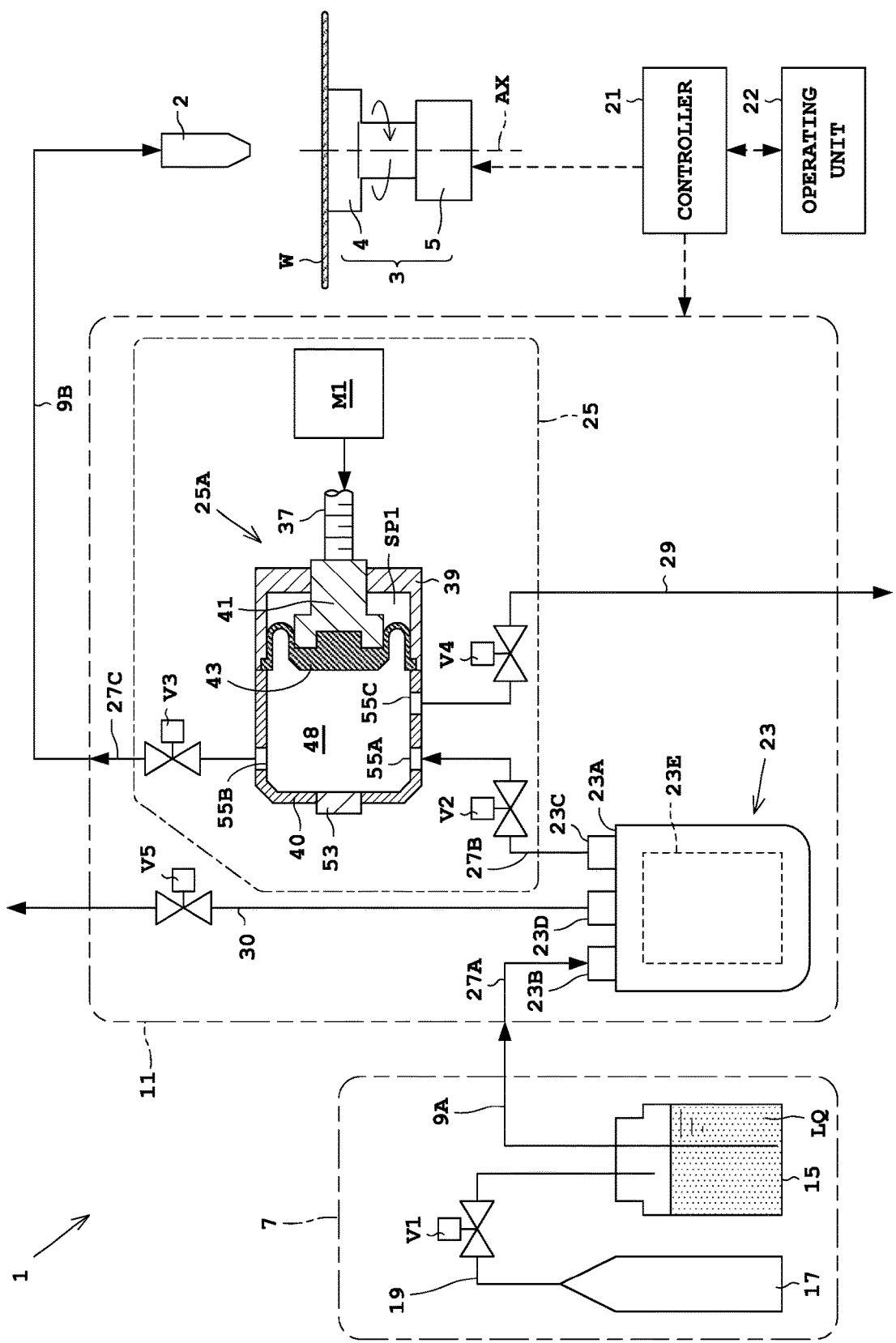
FIG. 1 schematically illustrates a substrate treating apparatus according to Embodiment 1.

The following describes Embodiment 1 of the present invention with reference to drawings. FIG. 1 schematically illustrates a substrate treating apparatus according to Embodiment 1.

Configuration of Substrate Treating Apparatus 1

Reference is made to FIG. 1. A substrate treating apparatus 1 includes a nozzle 2 and a holding rotator 3. The nozzle 2 discharges (dispenses) a treatment solution to a substrate W. Examples of the treatment solution used include a photoresist solution (hereinafter, referred to as a "resist solution" appropriately), a chemical for antireflection film formation, a developer, a rinse liquid. Examples of the rinse liquid used include a solvent, and deionized water (DIW). The holding rotator 3 rotates while holding the substrate W substantially horizontally.

The holding rotator 3 includes a spin chuck 4 and a rotary drive unit 5. The spin chuck 4 holds the substrate W in a rotatable manner around a rotation axis AX. The spin chuck 4 suction-holds a rear face of the substrate W, for example. The rotary drive unit 5 causes the spin chuck 4 to rotate around the rotation axis AX. The rotary drive unit 5 is formed by an electric motor and the like.

The substrate treating apparatus 1 further includes a liquid/gas supplying unit 7 (also referred to as a gas supplying unit), pipes 9A and 9B, and a treatment solution supplying device 11. The liquid/gas supplying unit 7 further includes a treatment solution container 15, a gas supplying source 17, a gas pipe 19, and an on-off valve V1. Here, the treatment solution corresponds to the liquid in the present invention.

The treatment solution container (e.g., a bottle) 15 stores the treatment solution. The pipe 9A is connected to the treatment solution container 15. Examples of the gas supplying source 17 include a gas supplying pipe installed in a plant or a container that stores gas. Examples of the gas include inactive gas such as nitrogen, and air. A gas pipe 19 connects the gas supplying source 17 with the treatment solution container 15. An on-off valve V1 is arranged on the gas pipe 19. The on-off valve V1 supplies gas from the gas supplying source 17 to the treatment solution container 15, and stops supply of the gas. When the gas is supplied through the gas pipe 19 into the treatment solution container 15, the supplied gas pushes out the treatment solution within the treatment solution container through the pipe 9A. The pushed treatment solution is fed through the pipe 9A into the treatment solution supplying device 11.

The substrate treating apparatus 1 further includes a controller 21 and an operating unit 22. The controller 21 includes one or more central processing unit (CPU). The controller 21 controls each element of the substrate treating apparatus 1 including the treatment solution supplying device 11. Consequently, the controller 21 corresponds to the controller of the pumping apparatus in the present invention. The operating unit 22 includes a display unit, a memory, and an input unit. The display unit is formed by a liquid crystal monitor, for example. The memory unit includes at least any of a read-only memory (ROM), a random-access memory (RAM), and a hard disk. The input unit includes at least any of a keyboard, a mouse, and various types of buttons. The memory unit stores various conditions and operation programs for substrate treatment.

Configuration of Treatment Liquid Supplying Device 11

The treatment solution supplying device 11 includes a filter 23 for filtering the treatment solution, and a pumping apparatus (first pumping apparatus) 25. The pumping apparatus 25 includes a pump body 25A, and on-off valves V2, V3, and V4. FIG. 1 illustrates the pumping apparatus 25 disposed downstream of the filter 23. However, the pumping apparatus 25 may be disposed upstream of the filter 23.

The treatment solution within the treatment solution supplying device 11 flows in pipes 27A to 27C. The filter 23 is arranged between on the pipes 27A and 27B. The filter 23 filters the treatment solution. The filter 23 is arranged on the pipe (flow path) 27B that is connected to the first opening 55A of the pumping apparatus 25, which is to be mentioned later. Moreover, the pumping apparatus 25 is disposed between the pipes 27B and 27C. The on-off valve V2 is arranged on the pipe 27B, whereas the on-off valve V3 is arranged on the pipe 27C. The on-off valve V2 causes the treatment solution to flow into the pipe 27B, and causes the treatment solution to stop flowing. The on-off valve V3 causes the treatment solution to flow into the pipe 27C, and causes the treatment solution to stop flowing. The pumping apparatus 25 is connected to an exhaust pipe 29. The on-off valve V4 is arranged on the exhaust pipe 29. The on-off valve V4 causes the treatment solution to flow into the exhaust pipe 29, and causes the treatment solution to stop flowing.

The filter 23 is detachable from the treatment solution supplying device 11. In addition, the filter 23 is replaceable. The filter 23 includes a top face 23A provided with an inlet (inflow port) 23B, an outlet (outflow port) 23C, and a vent 23D. The pipe 27A is connected to the inlet 23B, whereas the pipe 27B is connected to the outlet 23C. The vent 23D is connected to an exhaust pipe 30 for exhausting air bubbles. The exhaust pipe 30 is provided with an on-off valve V5. The vent 23D is an outlet for exhausting air bubbles and the like in the filter 23. The filter 23 includes a filter body 23E for filtering the treatment solution actually. Impurities such as air bubbles are removed through the filter body 23E. The vent 23D exhausts air bubbles prior to passage through the filter body 23E or the treatment solution containing air bubbles.

Figure 2:
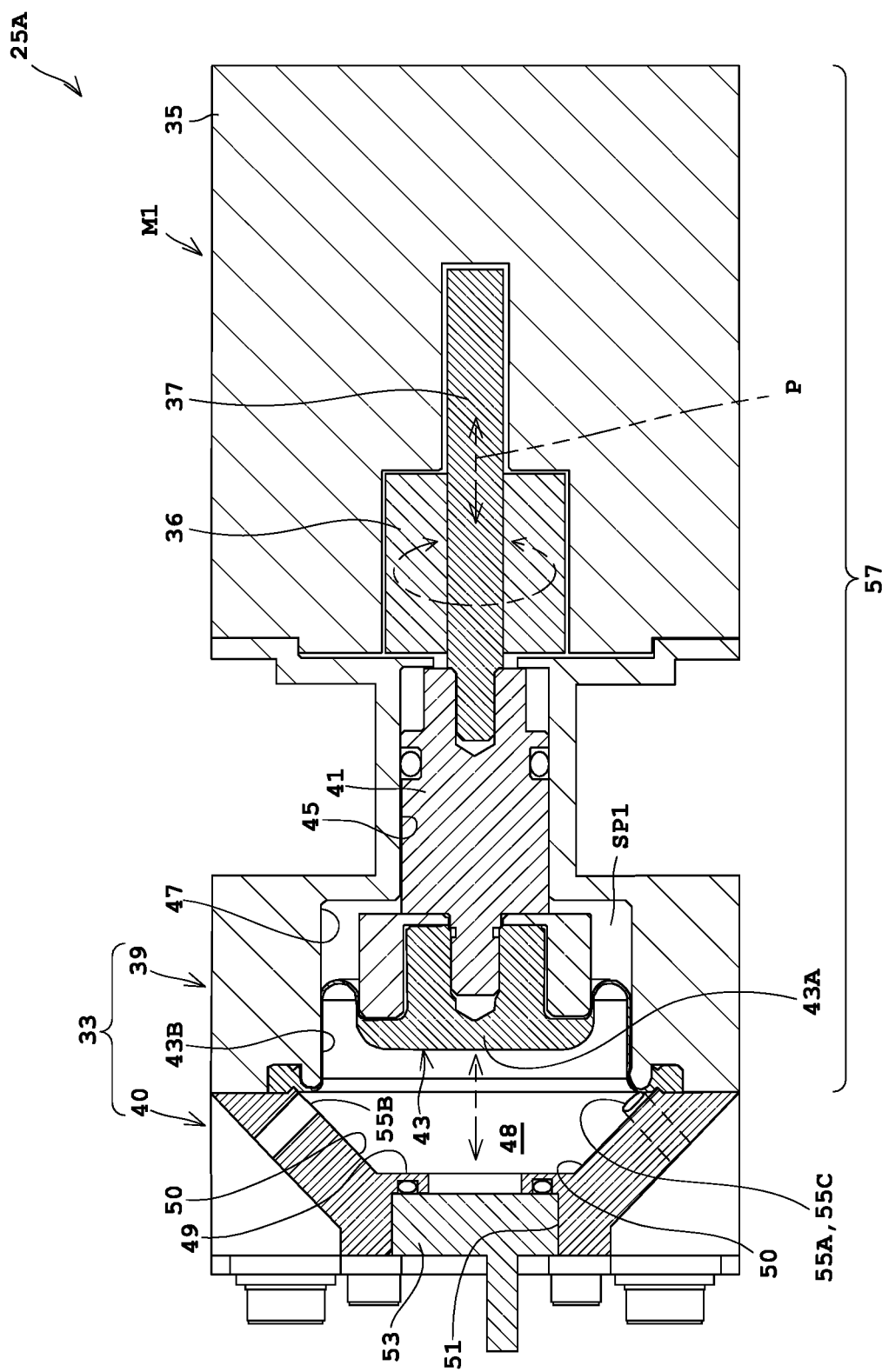
FIG. 2 is a longitudinal sectional view of a pump body.
Figure 3:
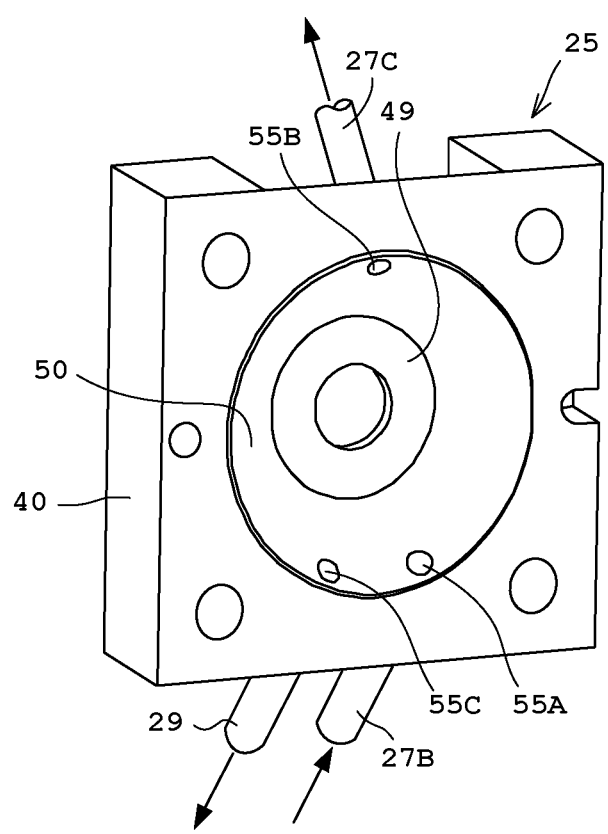
FIG. 3 is a perspective view of a chamber body seen from a diaphragm.

FIG. 2 is a longitudinal sectional view of a pump body 25A. FIG. 3 is a perspective view of a chamber body 40 seen from a diaphragm 43. The pump body 25A includes an electric motor M1 (hereinafter, referred to as a "motor") and a chamber 33. The motor M1 is, for example, a stepping motor. Specifically, as illustrated in FIG. 2, the motor M1 includes a stator 35, a cylindrical rotor 36, and a shaft (screw shaft) 37. The stator 35 generates a magnetic field along an inner side thereof. The rotor 36 is disposed in the inner side of the stator 35 in a rotatable manner and is rotated by the stator 35. The shaft 37 is screwed in a hollow part of the rotor 36 and reciprocates relative to the rotor 36 by rotation of the rotor 36.

The chamber 33 is attached to the motor M1. The chamber 33 includes a guide unit 39, and a chamber body 40 for storing the treatment solution. The guide unit 39 has a guide pin 41 inserted thereinto. The guide pin 41 has a first end coupled to the shaft 37. The guide pin 41 has a second end coupled to a thick portion 43A of the diaphragm 43 adjacent to the chamber body 40. The guide unit 39 includes a guide hole 45. The guide hole 45 guides the guide pin 41 horizontally as indicated by the arrow P in FIG. 2 without rotating the guide pin 41 around the shaft 37. In other words, a screw of the rotor 36 is engaged with a screw of the shaft 37. When the rotation of the rotor 36 is transmitted to the shaft 37, the guide pin 41 coupled to the shaft 37 is guided horizontally as indicated by the arrow P without being rotated around the shaft 37.

The guide unit 39 includes a recess 47 adjacent to the chamber body 40. The recess 47 accommodates the thick portion 43A at the center of the diaphragm 43 and the second end of the guide pin 41. The diaphragm 43 is provided so as to contact a reservoir 48 mentioned later. The diaphragm 43 is fixed such that an outer edge of a thin portion 43B thereof is nipped with a mating face of the guide unit 39 and the chamber body 40. That is, the outer edge of the thin portion 43B of the diaphragm 43 is attached to an inner wall of the guide unit 39 or the chamber body 40. The diaphragm 43 partially forms the inner wall of the chamber body 40. The diaphragm 43 separates the interior of the chamber body 40 from a space SP1 adjacent to the guide pin 41. The diaphragm 43 is made of resin such as polytetrafluoroethylene (PTFE). In the present embodiment, the diaphragm 43 is a rolling diaphragm. However, the diaphragm 43 may be another type of diaphragm, such as a flat diaphragm.

The chamber body 40 includes a reservoir 48. The reservoir 48 in the chamber body 40 is disposed opposite to the recess 47. The reservoir 48 is an interior space of the chamber body 40, and stores the treatment solution. The reservoir 48 is circular seen from the shaft 37 (see FIG. 3). The reservoir 48 includes a vertical face 49 orthogonal to the shaft 37. The vertical face 49 is formed opposite to the guide unit 39. The vertical face 49 has a diameter smaller than that of the recess 47 seen from the shaft 37. Moreover, the vertical face 49 includes a slope 50 so as to connect the outer edge of the vertical face 49 to a circle whose diameter is slightly larger than an inner wall of the recess 47. In other words, the reservoir 48 of the chamber body 40 is formed in a truncated cone shape. In addition, the vertical face 49 further includes an inspecting opening 51 for bring the reservoir 48 into communication with the outside. The inspecting opening 51 has a pressure sensor 53 attached thereto for measuring pressure within the reservoir 48.

As illustrated in FIGS. 2 and 3, the chamber body 40 includes three openings, or a first opening 55A, a second opening 55B, and a third opening 55C, that are in communication with the reservoir 48. As is apparent from the description hereunder, the first opening 55A in Embodiment 1 serves as an inflow port for feeding the treatment solution into the reservoir 48. The second opening 55B serves as an outflow port for feeding out the treatment solution in the reservoir 48 to the nozzle 2. The third opening 55C serves as a discharge port for discharging the treatment solution in the reservoir 48.

The first opening 55A and the third opening 55C are provided on a lower part of the slope 50. In addition, seen from the guide unit 39 as illustrated in FIG. 3, the first opening 55A and the third opening 55C are formed below a center portion of the reservoir 48 in a symmetrical positional relationship across the longitudinal center line of the reservoir 48. That is, the first opening 55A and the third opening 55C are provided around the bottom (almost the lowest position) of the reservoir 48 (in the chamber body 40). For instance, as illustrated in FIG. 3, the first opening 55A and the third opening 55C may be provided in the same level.

Moreover, the second opening 55B is provided at an upper part of the slope 50. In addition, as illustrated in FIG. 3, the second opening 55B is formed above the center portion of the reservoir 48 on the longitudinal center line of the reservoir 48. That is, the second opening 55B is provided on almost the highest position in the reservoir 48. Accordingly, the second opening 55B is provided higher in level than the first opening 55A and the third opening 55C.

As illustrated in FIG. 2, the first opening 55A, the second opening 55B, and the third opening 55C are formed in the chamber body 40 so as to extend orthogonally to the slope 50. The first opening 55A is connected to the pipe 27B. The second opening 55B is connected to the pipe 27C. The third opening 55C is connected to the exhaust pipe 29. Note that since the third opening 55c overlaps the first opening 55A, numerals "55A, 55C" are given both of the openings for illustrative convenience in FIG. 2. In addition, the nozzle 2 is provided at an end of the pipe (flow path) 27C 9B connected to the second opening 55B (see FIG. 1).

The treatment solution supplying device 11 with the above configuration causes the motor M1 to drive, whereby the shaft 37 and the guide pin 41 to move backwardly toward the motor M1 (rightward in FIG. 2). At this time, the on-off valves V2 to V4 each perform pre-set operation. This causes the thick portion 43A of the diaphragm 43 to be accommodated into the recess 47 in a retracted state (suction operation). By this operation, the treatment solution is sucked and stored in the reservoir 48. In contrast to this, the motor M1 drives to move the shaft 37 forwardly toward the chamber body 40 (leftward in FIG. 2). At this time, the on-off valves V2 to V4 each perform pre-set operation. This causes thick portion 43A of the diaphragm 43 to be moved forwardly to a position close to the vertical face 49 (feed-out operation). By this operation, the treatment solution stored in the reservoir 48 is fed out.

The diaphragm 43 corresponds to the movable part in the present invention. FIG. 2 illustrates a drive mechanism 57. The drive mechanism 57 includes the motor M1, the shaft 37, the guide unit 39, the guide pin 41, the guide hole 45, and the recess 47. The drive mechanism 57 corresponds to the drive unit in the present invention. The drive mechanism 57 displaces the diaphragm 43. The diaphragm 43 is displaced, whereby a volume of the reservoir 48 of the chamber 33 is changed. For instance, the diaphragm 43 (thick portion 43A) is moved into the reservoir 48, whereby the volume of the reservoir 48 decreased. The diaphragm 43 (thick portion 43A) is moved into the recess 47, whereby a space is generated in the recess 47 between the diaphragm 43 and the reservoir 48, leading to increase in volume of the reservoir 48.

Operation of Substrate Treating Apparatus 1

The following describes operation of the substrate treating apparatus 1. In FIG. 1, a substrate transport mechanism, not shown, transports the substrate W to the holding rotator 3. The holding rotator 3 suction-holds a rear face of the substrate W. Thereafter, a nozzle moving mechanism, not shown, moves the nozzle 2 from a standby position out of the substrate W to a given position above the center of the substrate W. After the nozzle 2 is moved, the treatment solution supplying device 11 feeds the treatment solution, supplied from the treatment solution container 15, to the nozzle 2 while the substrate W rotates or stops rotating. This causes the treatment solution to be discharged (dispensed) from the nozzle 2 on the substrate W.

The liquid/gas supplying unit 7 also feeds the treatment solution to the treatment solution supplying device 11. When the on-off valve V1 opens, the gas supplying source 17 supplies gas (e.g., nitrogen gas) through the gas pipe 19 to the treatment solution container 15. The gas supplied through the gas pipe 19 pushes the treatment solution from the treatment solution container 15 to the pipe 9A. This causes the treatment solution to be fed through the pipe 9A to the treatment solution supplying device 11.

After the treatment solution is discharged through the nozzle 2 to complete substrate treatment, the nozzle moving mechanism returns the nozzle 2 from the given position above the substrate W to the standby position. Thereafter, the holding rotator 3 releases its holding of the substrate W while the substrate W stops rotation. The substrate transport mechanism transports the substrate W from the holding rotator 3.

Operation of Treatment Liquid Supplying Device 11

The following describes operation of the treatment solution supplying device 11. The chamber body 40 includes the first opening 55A through which the treatment solution flows into, the second opening 55B through which the treatment solution flows out, and additionally the third opening 55C through which the treatment solution is discharged. This facilitates draining of the treatment solution from the chamber body 40 of the treatment solution supplying device 11. Firstly, description is made about a normal liquid feed of feeding the treatment solution to the nozzle 2, and thereafter about liquid draining by the pumping apparatus 25 in the treatment solution supplying device 11. It is assumed here that the on-off valves V1 to V5 are closed under normal conditions. The on-off valve V1 opens only when pressurizing is required.

The normal liquid feed is performed as under. The controller 21 performs control of circulation of the treatment solution in synchronization with the displacement of the diaphragm 43 by the first opening 55A and the second opening 55B. Accordingly, normal liquid feed is performed that the treatment solution is sucked into the reservoir 48 through the first opening 55A and the treatment solution in the reservoir 48 is fed out through the second opening 55B. Detailed description is as under. In FIG. 1, the liquid/gas supplying unit 7 feeds the treatment solution to an inlet 23B of the filter 23 through the pipes 9A, 27A. Impurities such as air bubbles in the treatment solution, fed to the inlet 23B of the filter 23, are removed through the filter body 23E, and then the treatment solution is fed to the outlet 23C and the pipe 27B in this order. That is, the treatment solution is fed to the on-off valve V2.

The pumping apparatus 25 sucks the treatment solution into the reservoir 48 (in the chamber body 40). That is, the motor M1 causes the diaphragm 43 and the guide pin 41 to retract rightward. This causes the diaphragm 43 to be displaced or deformed, whereby a volume of the reservoir 48 increases. When the shaft 37 and the guide pin 41 retract, the on-off valve V2 opens, whereas the on-off valves V3 to V5 close. This causes the first opening 55A in the chamber body 40 to suck the treatment solution into the reservoir 48.

After sucking the treatment solution, the pumping apparatus 25 feeds out the treatment solution within the reservoir 48. That is, the motor M1 causes the shaft 37 and the guide pin 41 to move forwardly to the left. This causes the diaphragm 43 to be displaced or deformed, whereby a volume of the reservoir 48 decreases. When the shaft 37 and the guide pin 41 move forwardly, the on-off valves V2, V4, V5 close, whereas the on-off valve V3 opens. This causes the treatment solution in the reservoir 48 to be fed through the second opening 55B in the chamber body 40 to the pipe 27C, the pipe 9B, and the nozzle 2, in this order. The nozzle 2 discharges the treatment solution.

The pumping apparatus 25 performs the liquid draining operation as under. The liquid draining operation is performed by supplying gas (pressurized gas) into the first opening 55A in the chamber body 40 and draining the treatment solution from the reservoir 48. An operator replaces the treatment solution container 15 in FIG. 1, for example, by an empty container with no treatment solution stored therein. Note that the empty container may be the treatment solution container 15 from which the treatment solution is fed out to be empty.

[Step S01] Liquid Draining Between Second Opening 55b of Pumping Apparatus 25 and Nozzle 2

Prior to Step S02, i.e., before gas is supplied to the first opening 55A, the reservoir 48, and the third opening 55C in this order to drain the treatment solution in the reservoir 48 through the third opening 55C, the controller 21 performs control to drain (discharge) the treatment solution between the second opening 55B of the pumping apparatus 25 and the nozzle 2. That is, the controller 21 performs control to open the on-off valves V2 and V3 and to close the on-off valves V4 and V5. In addition, the liquid/gas supplying unit 7 supplies the gas to the first opening 55A, the reservoir 48, the second opening 55B, the pipe 27C, and the pipe 9B in this order to drain the treatment solution stored between the second opening 55B and the nozzle 2.

Figure 4A:
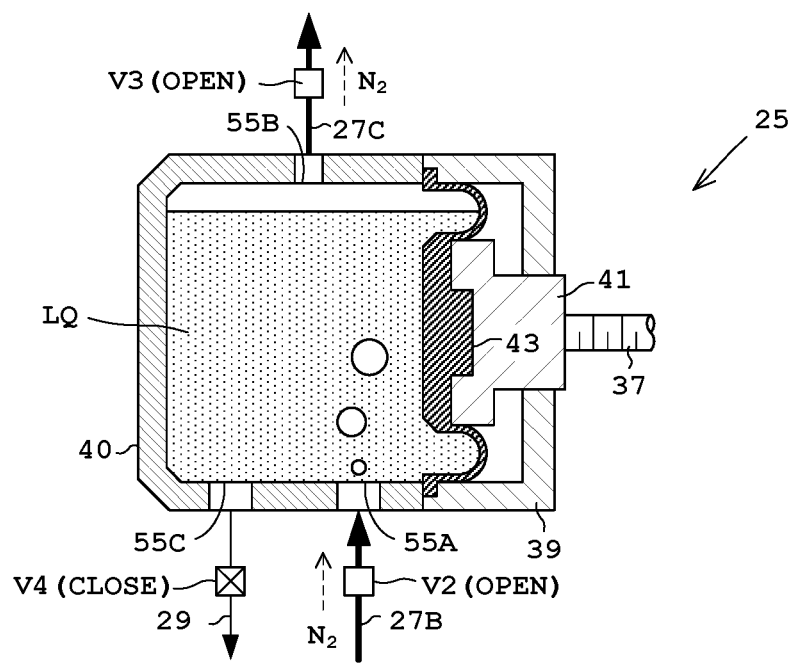
FIGS. 4A and 4B each illustrate operation of a pumping apparatus.

Detailed description is as under. The on-off valves V2 and V3 open, whereas the on-off valves V4 and V5 close. The liquid/gas supplying source 7 supplies gas from the gas supplying source 17 through the gas pipe 19 to the empty container. The gas supplied into the empty container is supplied to the pipe 9A, the pipe 27A, the filter 23, and the pipe 27B, in this order, while pushing the treatment solution. Then, as illustrated in FIG. 4A, the gas supplied to the pipe 27B is supplied into the reservoir 48 through the first opening 55A. The gas supplied into the reservoir 48 pushes the treatment solution in the reservoir 48 to some extent through the second opening 55B. Note that the numeral LQ represents the treatment solution in FIG. 4A, which is applicable to FIGS. 1, 4B, and 5. In addition, FIGS. 4A and 4B differ from FIG. 2 in position of the first opening 55A, the second opening 55B, and the third opening 55C for easy understanding. Actually, the first opening 55A, the second opening 55B, and the third opening 55C are positioned as in FIGS. 2 and 3. This is as with FIGS. 1, 5, 6, and 8 to 10.

Figure 4B:
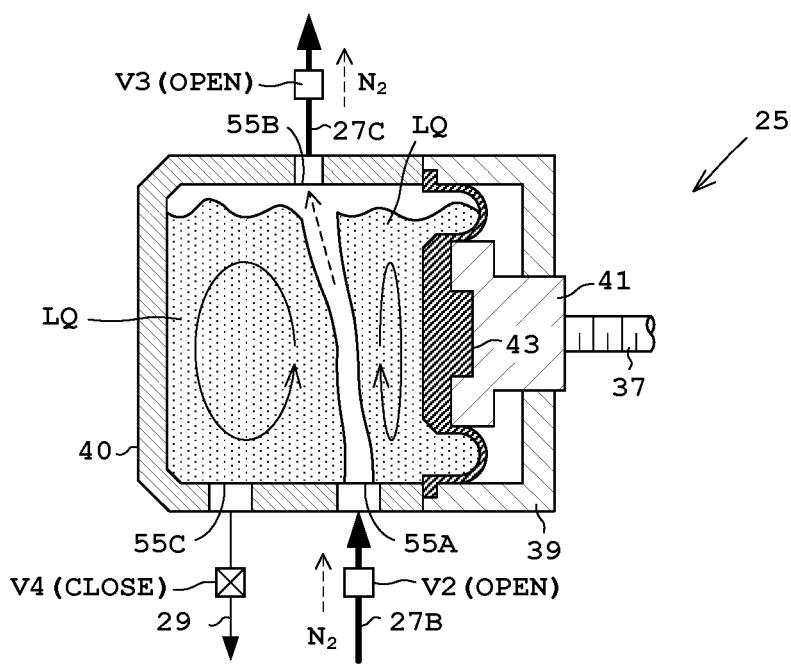

The second opening 55B is higher in level than the first opening 55A, and in almost the highest position within the reservoir 48. Accordingly, as illustrated in FIG. 4A, the gas supplied into the reservoir 48 moves toward the second opening 55B prior to the treatment solution before all the treatment solution in the reservoir 48 is pushed out through the second opening 55B. Consequently, the treatment solution remains in the reservoir 48. Also, if a large amount of gas is supplied into the reservoir 48, the treatment solution within the reservoir 48 is unable to be pushed out of the second opening 55B effectively as illustrated in FIG. 4B. Although the treatment solution remains in the reservoir 48, the gas is supplied to the first opening 55A, the reservoir 48, the second opening 55B, the pipe 27C, and the pipe 9B, in this order, leading to draining of the treatment solution from the second opening 55B to the nozzle 2, or the treatment solution within the pipes 9B, 27C and the nozzle 2.

During Step S01 and Step S02 mentioned later, the thick portion 43A of the diaphragm 43 may be accommodated in the recess 47 as in FIG. 2. Alternatively, the thick portion 43A may be close to the vertical face 49 so as not to prevent liquid flow. Here, the diaphragm 43 and the guide pin 41 are at rest.

[Step S02] Liquid Draining from Third Opening 55C of Pumping Apparatus 25

Figure 5:
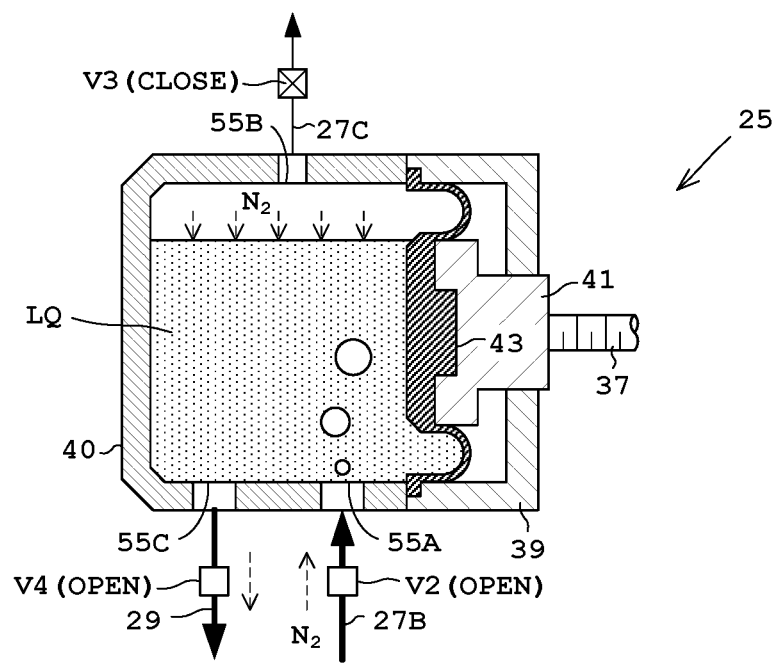
FIG. 5 illustrates operation of a pumping apparatus.

The controller 21 performs control to dispense the treatment solution in the reservoir 48 through the third opening 55C by introducing pressurized gas through the first opening 55A into the reservoir 48. That is, as illustrated in FIGS. 1 and 5, the controller 21 performs control to open the on-off valves V2 and V4 and to close the on-off valves V3 and V5. Moreover, the controller 21 controls the liquid/gas supplying unit 7 to supply the gas into the reservoir 48 through the first opening 55A, and to drain the liquid from the third opening 55C and the pipe 29.

Detailed description is as under. After Step S01, the on-off valves V3 and V5 close, and the on-off valves V2 and V4 open. Moreover, the liquid/gas supplying unit 7 supplies the gas from the supplying source 17 into an empty container and the reservoir 48 through the first opening 55A. The supplied gas pushes the treatment solution from the upper portion within the reservoir 48 through the third opening 55C. Accordingly, the supplied gas pushes the treatment solution through the third opening 55C to the exhaust pipe 29. The third opening 55C is lower in level than the second opening 55B, and on the interior bottom of the reservoir 48. Consequently, the supplied gas allows easy draining of the treatment solution in the reservoir 48. In addition, Steps S01 and S02 achieves draining of the treatment solution in the reservoir 48, the exhaust pipe 29, the pipes 27A to 27C, 9A, and 9B, and the nozzle 2. It should be noted that Step S1 is performable after Step S02.

Here, the filter 23 is arranged for the liquid draining operation. However, another filter without the filter body 23E may perform connection between the pipe 27A and the pipe 27B.

With this embodiment, the chamber 33 includes at least three openings, or the first opening 55A, the second opening 55B, and the third opening 55C that are in communication with the reservoir 48. The second opening 55B is higher in level than the first opening 55A. The third opening 55C is used for discharging the treatment solution in the reservoir 48 by introducing the pressurized gas through the first opening 55A into the reservoir 48. The third opening 55C is disposed around the bottom of the reservoir 48, achieving easy draining of the treatment solution stored in the reservoir 48.

That is, the second opening 55B is provided higher in level than the first opening 55A for draining air contained in the treatment solution within the reservoir 48 as in FIG. 4A. Accordingly, the second opening 55B has difficulty in draining the treatment solution in the reservoir 48. Accordingly, the third opening 55C drains the treatment solution in the reservoir 48. The third opening 55C is lower in level than the second opening 55B, and is provided on the interior bottom of the reservoir 48. This allows ready draining of the treatment solution in the reservoir 48.

Moreover, the first opening 55A and the third opening 55C are provided in the same level. This achieves reverse connection of pipes between the first opening 55A and the third opening 55c as in FIG. 3, for example. That is, pressurized gas is able to be introduced through the third opening 55C into the reservoir 48, and the treatment solution within the reservoir 48 is able to be discharged through the first opening 55A. This simplifies connection of the pipes.

Embodiment 2

The following describes Embodiment 2 of the present invention with reference to drawings. Here, the description common to that of Embodiment 1 is to be omitted.

The treatment solution supplying device 11 of Embodiment 1 includes the single pumping apparatus 25. In contrast to this, a treatment solution supplying device 61 of Embodiment 2 includes a second pumping apparatus 63 in addition to the pumping apparatus 25. In Embodiment 2, the pumping apparatus 25 is referred to as a first pumping apparatus 25.

Figure 6:
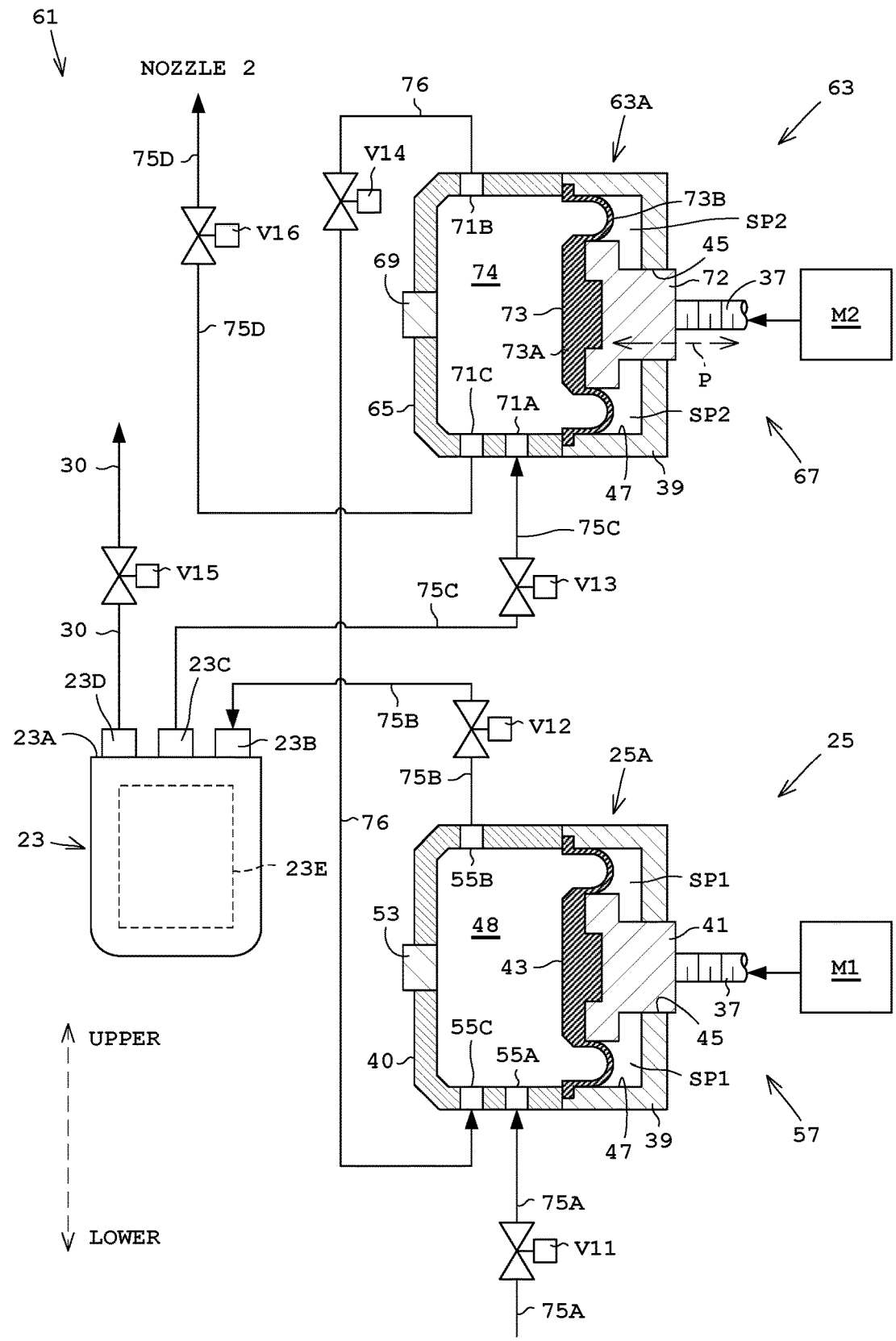
FIG. 6 illustrates a treatment solution supplying device according to Embodiment 2.

FIG. 6 illustrates the treatment solution supplying device 61 according to Embodiment 2. The treatment solution supplying device 61 includes the filter 23, the first pumping apparatus 25, and the second pumping apparatus 63. In Embodiment 1, the first pumping apparatus 25 is disposed downstream of the filter 23. On the other hand, the first pumping apparatus 25 in Embodiment 2 is disposed upstream of the filter 23. Moreover, the second pumping apparatus 63 is disposed downstream of the filter 23.

Figure 7A:
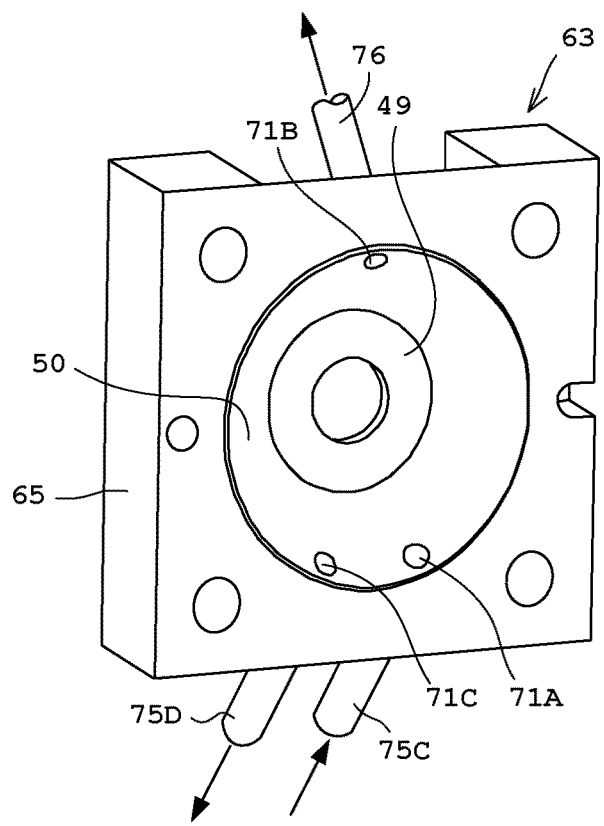
FIG. 7A is a perspective view of a second chamber body seen from a diaphragm of FIG. 6.
Figure 7B:
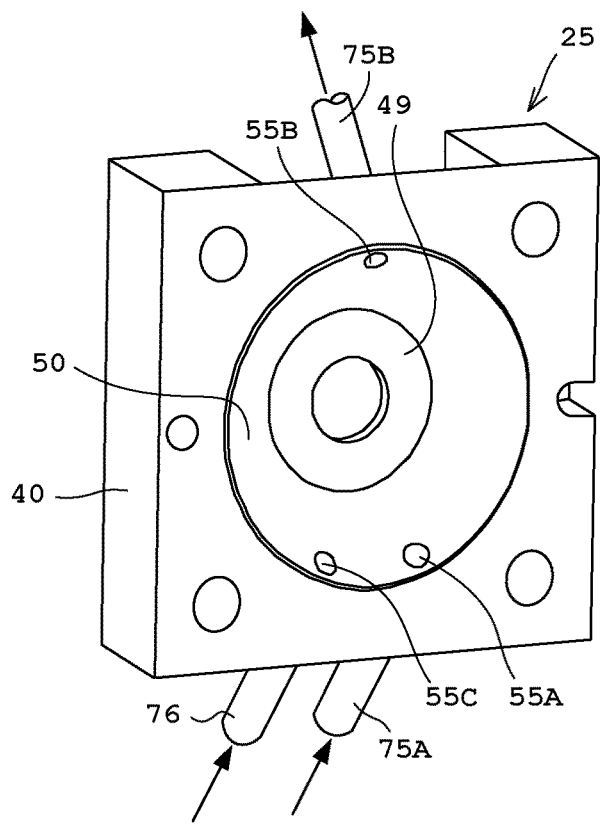
FIG. 7B is a perspective view of a first chamber body seen from the diaphragm of FIG. 6.

The first pumping apparatus 25 includes the pump body 25A, and on-off valves V11, V12, and V14 as in FIG. 6, FIG. 7B and Embodiment 1. The pump body 25A includes the chamber body 40, a drive mechanism 57, the first opening 55A, the second opening 55B, the third opening 55C, and a pressure sensor 53. The on-off valve V11 is provided on a pipe 75A that is connected to the first opening 55A. The on-off valve V12 is provided on a pipe 75B that is connected to the second opening 55B. The on-off valve V14 is provided on a pipe 76 that is connected to the third opening 55C. The reservoir 48 is the interior space that stores the treatment solution. The drive mechanism 57 displaces the diaphragm 43 for changing the volume of the reservoir 48. As illustrated in FIG. 2, the drive mechanism 57 includes the motor M1, the shaft 37, the guide unit 39, the guide pin 41, the guide hole 45, and the recess 47. The details of the pumping apparatus 25 are the same as in Embodiment 1.

The second pumping apparatus 63 has substantially the same configuration as the pumping apparatus 25 in FIG. 2. That is, the second pumping apparatus 63 includes the pump body 63A, and the on-off valves V13, V14, and V16 as illustrated in FIG. 6. The pump body 63A includes a second chamber body 65, a second drive mechanism 67, the pressure sensor 69, a first opening 71A, a second opening 71B, and a third opening 71C. The on-off valve V13 is provided on a pipe 75C that is connected to the first opening 71A. The on-off valve V14 is provided on a pipe 76 that is connected to the second opening 71B. The on-off valve V16 is provided on a pipe 75D that is connected to the third opening 71C. Here, the on-off valve V14 is shared by the first pumping apparatus 25 and the second pumping apparatus 63. A second reservoir 74 is an interior space that stores the treatment solution. The second drive mechanism 67 displaces the second diaphragm 73 for changing the volume of the second reservoir 74.

As illustrated in FIGS. 2 and 6, the second drive mechanism 67 includes an electric motor M2 (hereinafter, referred to as a "motor M2"), the second shaft 37, the second guide unit 39, the second guide pin 72, the second guide hole 45, and the second recess 47. Here, the same numerals to the first pumping apparatus 25 are given to elements other than the motor M2, the second guide pin 72, and the second diaphragm 73. The second guide pin 72 is guided horizontally as indicated by the arrow P in FIG. 2. The second diaphragm 73 includes a thick portion 73A and a thin portion 73B. The thick portion 73A at the center portion of the second diaphragm 73 is coupled to the second guide pin 72. The outer edge of the thin portion 73B of the second diaphragm 73 is attached to an inner wall of the second guide unit 39 or the second chamber body 65 to form a part of the inner wall of the second chamber 65. The second diaphragm 73 separates the second reservoir 74 (the interior of the second chamber body 65) from a space SP2 adjacent to the second guide pin 72. Rotation generated by the motor M2 is converted into linear movement by rotator (not shown), the second shaft 37 and the second guide hole 45.

As illustrated in FIGS. 6 and 7A, the second chamber body 65 includes a first opening 71A, a second opening 71B, and a third opening 71C. The second opening 71B causes a part of the treatment solution within the second reservoir 74 to return into the first pumping apparatus 25. The first opening 71A, the second opening 71B, and the third opening 71C are formed in the second chamber body 65 so as to extend orthogonally to the slope 50 (see FIGS. 2 and 7A). That is, the three opening 71A to 71C are in communication with the second reservoir 74. The first opening 71A and the third opening 71C are provided around the bottom (almost the lowest position) in the second chamber body 65. The second opening 71B is provided higher in level than the first opening 71A and the third opening 71C.

The treatment solution within the treatment solution supplying device 61 flows in pipes 75A to 75D and a return pipe 76. The pipe 75A connects the pipe 9A, shown in FIG. 1, to the first opening 55A of the first pumping apparatus 25. The pipe 75B connects the second opening 55B of the first pumping apparatus 25 to the inlet 23B of the filter 23. The pipe 75C connects the outlet 23C of the filter 23 to the first opening 71A of the second pumping apparatus 63. The pipe 75D connects the third opening 71C of the second pumping apparatus 63 to the nozzle 2 shown in FIG. 1. That is, the nozzle 2 is provided at an ends of the pipes 75D and 9B connected to the third opening 71C of the second opening 63. The pipe 76 connects the second opening 71B of the second pumping apparatus 63 to the third opening 55C of the first pumping apparatus 25. The on-off valve V15 is arranged on the exhaust pipe 30.

Here, the pipe 75A corresponds to the first flow path in the present invention. The on-off valve V11 corresponds to the first on-off valve in the present invention. Here, the pipe 75B corresponds to the second flow path in the present invention. The on-off valve V12 corresponds to the second on-off valve in the present invention. Here, the pipe 75C corresponds to the third flow path in the present invention. The on-off valve V13 corresponds to the third on-off valve in the present invention. Here, the pipe 76 corresponds to the fourth flow path in the present invention. The on-off valve V14 corresponds to the fourth on-off valve in the present invention. Here, the pipe 75D corresponds to the fifth flow path in the present invention. The on-off valve V16 corresponds to the fifth on-off valve in the present invention.

Operation of Treatment Liquid Supplying Device 61

The following describes operation of the treatment solution supplying device 61. Firstly, description is made about a normal liquid feed of feeding the treatment solution, and thereafter about liquid draining.

The summary of the normal liquid feed is described as under. As illustrated in FIG. 6, the controller 21 performs control to open/close the on-off valves V11 to V16 in synchronization with the displacement of the diaphragms 43 and 73 of the first and second pumping apparatus 25 and 63. Accordingly, the first pumping apparatus 25 sucks the treatment solution through the pipe 75A and the first opening 55A. In addition, the first pumping apparatus 25 feeds the treatment solution to the filter 23 through the second opening 55B and the pipe 75B. Then, the second pumping apparatus 63 sucks the treatment solution, filtered by the filter 23, through the pipe 75C and the first opening 71A. Moreover, the second pumping apparatus 63 returns a part of the sucked treatment solution to the third opening 55C of the first pumping apparatus 25 through the second opening 71B and the pipe 76, and feeds out the residue of the sucked treatment solution through the third opening 71C and the pipe 75D. The detailed normal liquid feed is described as under.

FIGS. 8A to 8E each illustrate operation of the treatment solution supplying device 61. The controller 21 in FIG. 1 controls drive of the first and second pumping apparatus 25 and 63, and controls circulation of the treatment solution.

[Step T01] Ready

Figure 8A:
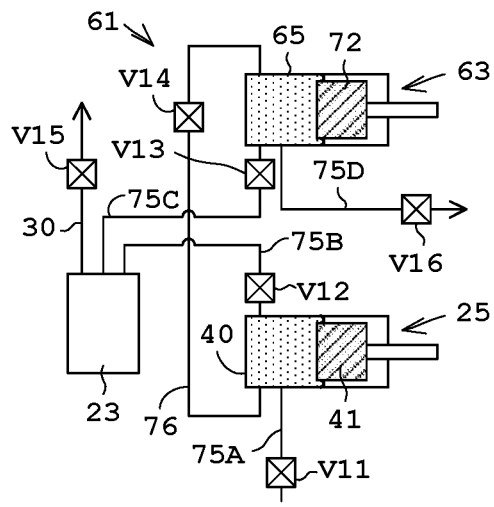
FIGS. 8A to 8E each illustrate operation of the treatment solution supplying device.

Firstly, described is a ready step illustrated in FIG. 8A. By a suction step, a filtering step, a purge step, and a discharging step, the treatment solution is brought into a suction condition in the first chamber 40 (reservoir 48) of the first pumping apparatus 25 and the second chamber body 65 (second reservoir 74) of the second pumping apparatus 63 as illustrated in FIG. 8A. Note that the on-off valves V11 to V16 close in FIG. 8A.

[Step T02] Dispense

Figure 8D:
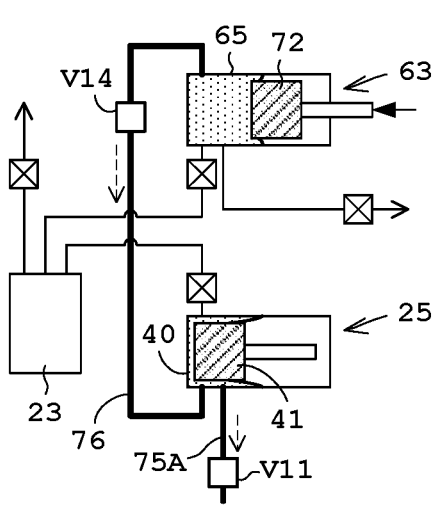
Figure 8B:
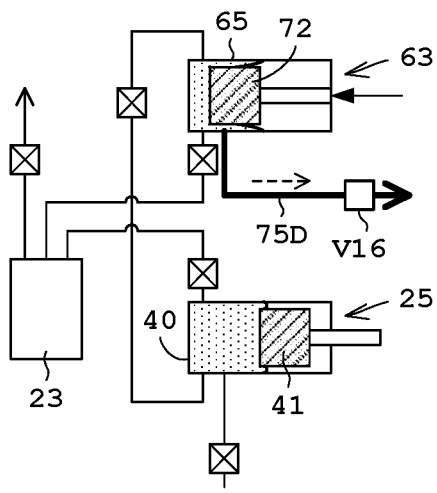

FIG. 8B illustrates the dispense step. The second pumping apparatus 63 moves the second guide pin 72 forwardly in the left. At this time, the on-off valve V16 opens, whereas the on-off valves V11 to V15 close. This causes the treatment solution sucked into the second chamber body 65 of the second pumping apparatus 63 to be fed through the nozzle 2 where the treatment solution is discharged.

[Step T03] Filtering

Figure 8E:
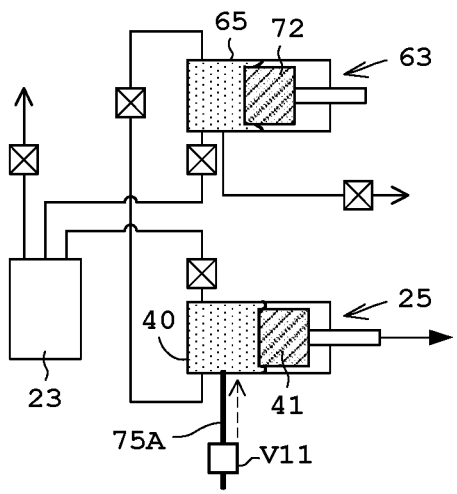
Figure 8C:
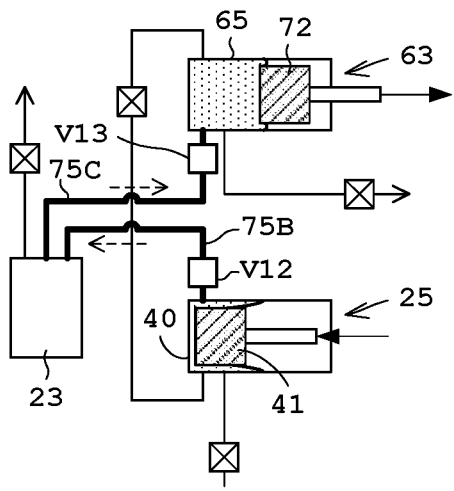

FIG. 8C illustrates the filtering step. In FIG. 8B, the treatment solution is kept sucked in the chamber body 40 of the first pumping apparatus 25. The treatment solution is sucked through the filter 23 into the second chamber body 65 of the second pumping apparatus 63. That is, the pumping apparatus 25 moves the guide pin 41 forwardly to the left, whereas the second pumping apparatus 63 moves the second guide pin 72 forwardly to the right. At this time, the on-off valves V12 and V13 open, whereas the on-off valves V11 and V14 to 16 closes.

[Step T04] Purge

FIG. 8D illustrates the purge step. The second pumping apparatus 63 moves the second guide pin 72 slightly forwardly in the left. At this time, the on-off valves V11 and V14 open, whereas the on-off valves V12, V13, V15, and V16 close. This causes the treatment solution with air bubbles in the second chamber body 65 to return to the chamber body 40 of the first pumping apparatus 25 through the return pipe 76. The air bubbles back into the chamber body 40 are removed through the filter 23 in the filtering step.

[Step T05] Suction

FIG. 8E illustrates the suction step. The first pumping apparatus 25 moves the second guide pin 41 backwardly to the right. At this time, the on-off valve V11 opens, whereas the on-off valves V12 to 16 closes. This causes the treatment solution to be sucked in the chamber body 40 of the first pumping apparatus 25. Moreover, this leads to the situation like the ready step in FIG. 8A. The Steps T01 to T05 are repeated.

The discharging step and the suction step are performed simultaneously in the case of successive dispense. In this case, the discharging step and the suction step (Steps T02 and T05), the filtering step (Step T03), and the purge (Step T04) are repeated in this order, for example. When the air bubbles are discharged from the vent 23D (see FIG. 6) of the filter 23, the first pumping apparatus 25 moves the guide pin 41 forwardly to the left. At this time, the on-off valves V12 and V15 open, whereas the on-off valves V11, V13, V14, and V16 close.

Description will be given next of operations of the liquid draining with reference to FIGS. 9 and 10. It is assumed here that the on-off valves V11 to V16 close under normal conditions. The on-off valve V1 in FIG. 1 opens only when pressurizing is required.

The liquid draining is an operation of supplying the gas from the liquid/gas supplying unit 7 into the first pumping apparatus 25 and the second pumping apparatus 63, and draining the treatment solution in the reservoir 48, the second reservoir 74, the pipes 75B, 75C, and 76. An operator replaces the treatment solution container 15 in FIG. 1, for example, by an empty container with no treatment solution stored therein. Moreover, the operator causes the treatment solution within the treatment solution container 15 to be fed out to empty the treatment solution container 15.

[Step S11] Liquid Drawing in Reservoir 48 and Pipe 76

Figure 9:
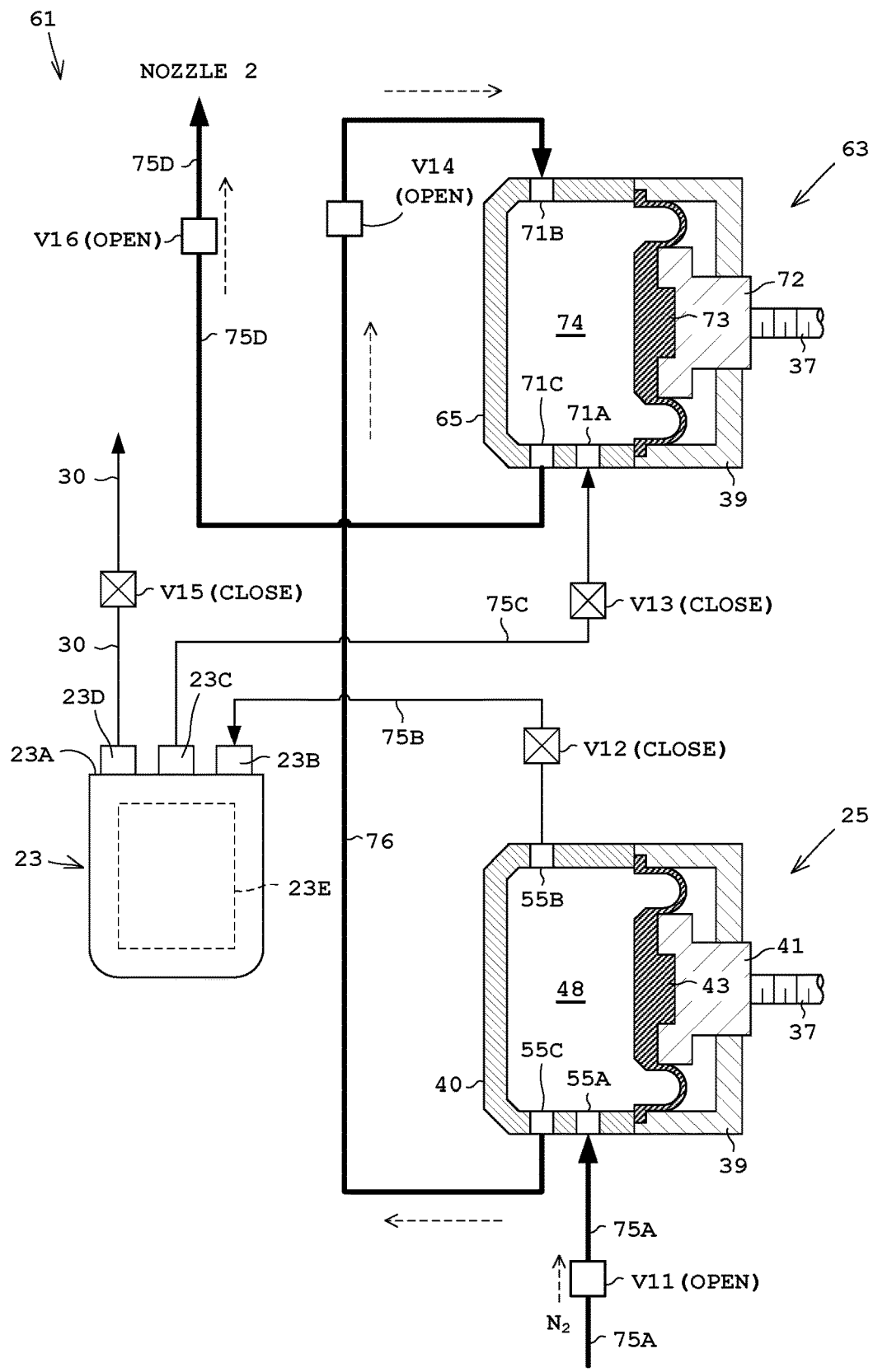
FIG. 9 illustrates liquid draining by the first chamber body and a return pipe.

In FIG. 9, the controller 21 performs control to open the on-off valves V11, V14, and V16 (opened state), and to close the on-off valves V12, V13, and V15 (closed state). Under such conditions, the controller 21 performs control to dispense the treatment solution in the reservoir 48 through the third opening 55C and the pipe 76 to the second pumping apparatus 63 by feeding the pressurized gas through the pipe 75A and first opening 55A into the reservoir 48 of the first pumping apparatus 25. Moreover, the controller 21 performs control to feed the pressurized gas, supplied from the first pumping apparatus 25 through the pipe 76, into the second reservoir 74 of the second pumping apparatus 63, and to dispense the liquid within the second reservoir 74 of the second pumping apparatus 63 through the third opening 71C and the pipe 75D.

Detailed description is as under. As illustrated in FIG. 1, the liquid/gas supplying unit 7 supplies the gas from the supplying source 17 into the pipe 9A through the empty container to push out the treatment solution within the pipes 9A and 75A toward the nozzle 2. The treatment solution pushed by the gas flows through the pipes 9A, 75A, the first opening 55A, the reservoir 48, the third opening 55C, the pipe 76, the second opening 71B, the second reservoir 74, the third opening 71C, the pipes 75D and 9B, and the nozzle 2, in this order, to be discharged through the nozzle 2.

As noted above, the on-off valves V11, V14, and V16 open and the on-off valves V12, V13, and V15 close, whereby the treatment solution within the reservoir 48 of the first pumping apparatus 25 and the pipes 75A, 75D, and 76 is able to be drained out. Moreover, the treatment solution within the second reservoir 74 of the second pumping apparatus 63 is able to be drained out. In contrast to this, through the liquid draining mentioned above, the treatment solution in the pipes 75B and 75C between the first pumping apparatus 25 and the second pumping apparatus 63 is unable to be drained. Accordingly, the on-off valves V11 to V16 are operated as under.

[Step S12] Liquid Drawing in Pipe 75B, 75C and Second Chamber Body 65

Figure 10:
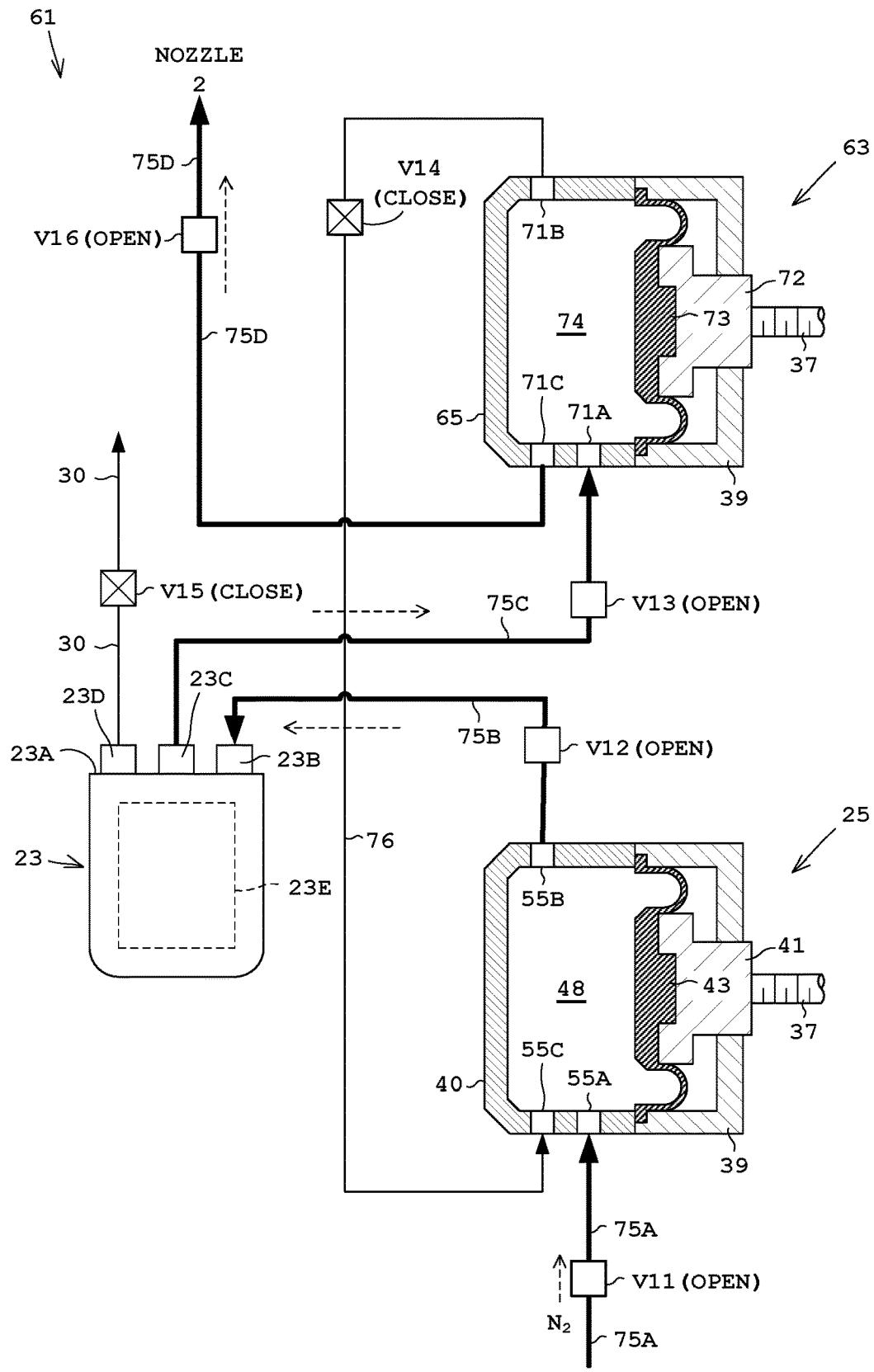
FIG. 10 illustrates liquid draining by a feed flow path and the second chamber body.

In FIG. 10, the controller 21 performs control to open the on-off valves V11 to V13 and V16 (opened state), and to close the on-off valves V14 and V15 (closed state). Under this condition, the controller 21 performs control to supply the pressurized gas through the pipe 75A and the first opening 55A to the reservoir 48 of the first pumping apparatus 25. Moreover, the controller 21 performs control to supply the pressurized gas from the second opening 55B of the first pumping apparatus 25 through the pipe 75B to the filter 23, and to supply the gas from the filter 23 through the pipe 75C and the first opening 71A of the second pumping apparatus 63 to the second reservoir 74 of the second pumping apparatus 63. Then, the controller 21 performs control to dispense the treatment solution within the reservoir 74 of the second pumping apparatus 63 through the third opening 71C and the pipe 75D.

Detailed description is as under. With Step S11, the treatment solution within the pipes 9A and the 75A and the reservoir 48 is drained. When the liquid/gas supplying unit 7 supplies the gas into the pipe 9A, the gas supplied into the reservoir 48 pushes the treatment solution in the pipes 75B and 75C between the first pumping apparatus 25 and the second pumping apparatus 63 toward the nozzle 2. The treatment solution pushed by the gas flows through the pipes 75B, 75C, the first opening 71A, the second reservoir 74, the third opening 71C, the pipes 75D and 9B, and the nozzle 2, in this order, to be discharged through the nozzle 2.

As noted above, the on-off valves V11 to V13 and V16 open and the on-off valves V14 and V15 close, whereby the treatment solution within the second reservoir 74, the pipes 75A, 75D, and the nozzle 2 is able to be drained out. In Step S11, the treatment solution within the second reservoir 74 is drained. In contrast to this, in Step S12, the treatment solution in the pipes 75B and 75C flows into the second reservoir 74, and accordingly, additional liquid draining in the second reservoir 74 is performed in Step S12.

It should be noted that Step S11 is performable after Step S12. That is, Step 12 is performed before or after first liquid draining in Step S11 that discharges the treatment solution from the reservoir 74. Moreover, when only Step S12 is performed, the gas reaches to the second opening 55B prior to the treatment solution in the reservoir 48 (first chamber body 40) as illustrated in FIG. 4B. Consequently, the treatment solution remains in the reservoir 48. The treatment solution also remains in the pipe 76. Consequently, Step S11 allows draining of the treatment solution in the reservoir 48 and the return pipe 76.

Moreover, in Step S12, the on-off valves V11, V12, V13, and 16 open in this order, whereby reverse flow of the treatment solution in the pipe 75B from the second opening 55B to the reservoir 48 is avoidable. In Step S11, the on-off valve V11, V14, V16 open in this order.

According to the present embodiment, during the normal liquid feed, the treatment solution is fed from the second opening 71B of the second pumping apparatus 63 through the pipe 76 to the third opening 55C of the first pumping apparatus 25. During the liquid draining of the present invention, the on-off valves V11, V14, and V16 open and the on-off valves V12 and V13 close, whereby the treatment solution flows reversely relative to the normal liquid feed. In other words, during the normal liquid feed, the treatment solution is fed from the third opening 55C of the first pumping apparatus 25 through the pipe 76 to the second opening 71B of the second pumping apparatus 63. The third opening 55C of the first pumping apparatus 25 is disposed around the bottom of the reservoir 48, achieving easy draining of the treatment solution stored in the reservoir 48 of the first pumping apparatus 25. The third opening 71C of the second pumping apparatus 63 is disposed around the bottom of the second reservoir 74 (the interior of the second chamber body 65), achieving ready draining of the treatment solution stored in the second reservoir 74. Moreover, the liquid in the pipe 76 between the third opening 55C of the first pumping apparatus 25 and the second opening 71B of the second pumping apparatus 63 is able to be drained.

Moreover, the on-off valves V11 to V13 and V16 open, and the on-off valves V14 and V15 close. Accordingly, since the third opening 71C of the second pumping apparatus 63 is disposed around the bottom of the second reservoir 74, the treatment solution stored in the second reservoir 74 is able to be drained easily. Moreover, the treatment solution in the pipes 75B, 75C between the second opening 55B of the first pumping apparatus 25 and the first opening 71A of the second pumping apparatus 63 is able to be drained. Consequently, at least the treatment solution in the reservoir 48 of the first pumping apparatus 25, the second reservoir 74 of the second pumping apparatus 63, and the pipes 75B, 75C, and 76 is able to be drained.

Embodiment 3

Figure 11:
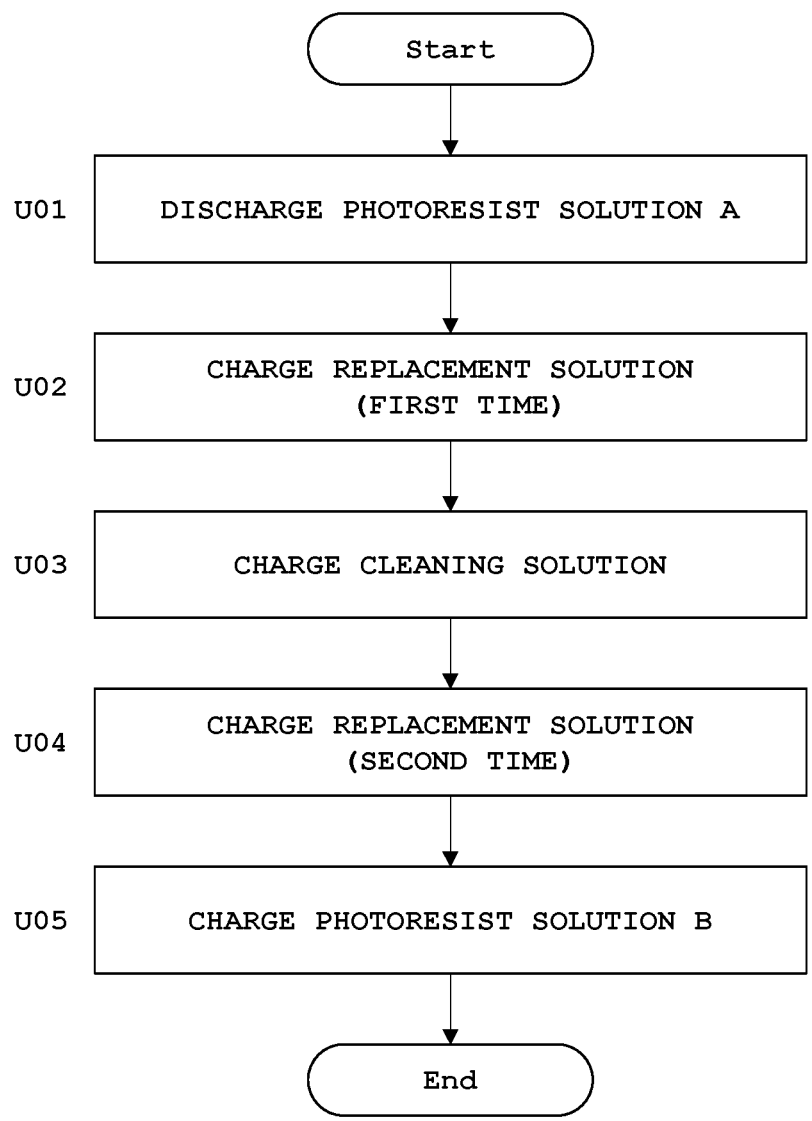
FIG. 11 is a flow chart of replacement of a photoresist solution A by a photoresist solution B.

The following describes Embodiment 3 of the present invention. Here, the description common to that of Embodiments 1 and 2 is to be omitted. FIG. 11 is a flow chart of replacement of a resist solution A by a resist solution B.

Embodiments 1 and 2 each describe operation of supplying gas into the first opening 55A in the chamber body 40 and draining the treatment solution from the chamber body 40. In contrast to this, the following describes replacement of the resist solution A by the resist solution B with reference to FIG. 11 as one application of the liquid draining. Here, the description is made about the substrate treating apparatus 1 with the treatment solution supplying device 11 illustrated in FIG. 1. However, this is applicable to the treatment solution supplying device 61 illustrated in FIG. 6. It is assumed here that the on-off valves V2 to V5 are closed under normal conditions. The on-off valve V1 opens only when pressurizing is required.

[Step U01] Discharging Photoresist A

The liquid draining in Steps S01 and S02 of Embodiment 1 is performed to drain the resist solution A from the reservoir 48. In Embodiment 2, the liquid draining in Steps S11 and S12 is performed.

[Step U02] Charging Replacement Solution (First Time)

A replacement solution different from the resist solution A is charged through the first opening 55A into the treatment solution supplying device 11, e.g., the reservoir 48. Examples of the replacement solution include OK73 thinner (available from TOKYO OHKA KOGYO CO., LTD), propylene glycol monomethyl ether (PGME), and propylene glycol monomethyl ether acetate (PGMEA). A cleaning solution reacts strongly with the resist solutions A and B. Consequently, the replacement solution is brought into flow into the treatment solution supplying device 11 to rinse the resist solution A or another cleaning solution mentioned later.

Detailed description is as under. The empty treatment solution container 15 is replaced by a replacement solution container with the replacement solution. Thereafter, the on-off valve V1 opens to supply the gas from the gas supplying source 17 to the replacement solution container. Then, the treatment solution supplying device 11 replaces the resist solution A between the pipe 9A and the nozzle 2 by the replacement solution by repeating operation of the suction and feed (normal liquid feed). That is, the on-off valve V2 opens, the on-off valve V3 to V5 close, and the shaft 37 and the guide pin 41 move backwardly to the right. This causes suction of the replacement solution from the first opening 55A into the reservoir 48. Then, the on-off valve V3 opens, the on-off valve V2, V4, and V5 close, and the shaft 37 and the guide pin 41 move forwardly to the left. This causes feed of the replacement solution, sucked into the reservoir 48, from the second opening 55B. Such repeated suction and feed causes the interior of the treatment solution supplying device 11 to be rinsed with the replacement solution. The replacement solution may be fed into the exhaust pipes 29 and 30 and the pipe 76.

[Step U03] Charging Cleaning Solution

The cleaning solution is charged through the first opening 55A while the replacement solution is stored in the reservoir 48 for cleaning the interior of the reservoir 48. Examples of the cleaning solution include N-methyl-2-pyrrolidone (NMP), gamma-Butyrolactone, and acetone.

The replacement solution container is replaced by a cleaning solution container with the cleaning solution. Thereafter, the on-off valve V1 opens to supply the gas from the gas supplying source 17 to the cleaning solution container. Then, the treatment solution supplying device 11 replaces the replacement solution between the pipe 9A and the nozzle 2 by the cleaning solution by repeating operation of the suction and feed. This yields cleaning a region between the pipe 9A and the nozzle 2, the region including the reservoir 48. The interior of the exhaust pipes 29 and 30 and the pipe 76 may be cleaned.

[Step U04] Charging Replacement Solution (Second Time)

The replacement solution is charged from the first opening 55A into the reservoir 48 containing a cleaning solution. The cleaning solution container is replaced by the replacement solution container. Thereafter, the on-off valve V1 opens to supply the gas from the gas supplying source 17 to the replacement solution container. Then, the treatment solution supplying device 11 replaces the cleaning solution between the pipe 9A and the nozzle 2 by the replacement solution by repeating operation of the suction and feed. The replacement solution may be fed into the exhaust pipes 29 and 30 and the pipe 76.

[Step U05] Charging Photoresist Solution B

The resist solution B is charged through the first opening 55A into the reservoir 48 while the replacement solution is stored in the reservoir 48. The replacement solution container is replaced by a treatment solution container with the resist solution B. Thereafter, the on-off valve V1 opens to supply the gas from the gas supplying source 17 to the treatment solution container. Then, the treatment solution supplying device 11 replaces the replacement solution between the pipe 9A and the nozzle 2 by the resist solution B by repeating operation of the suction and feed.

Alternatively, after the replacement solution is charged in Step U02, the charged replacement solution may be drained as in Step U01. Specifically, the treatment solution supplying device 11 causes the replacement solution to flow from the pipe 9A to the nozzle 2 to rinse the interior of the treatment solution supplying device 11. Thereafter, the diaphragm 43 and the guide pin 41 of the treatment solution supplying device 11 stop operation when the replacement solution container is replaced by an empty container or the replacement solution is fed out to empty the container. Then, the liquid draining in Steps S01 and S02 of Embodiment 1 is performed. Likewise, in Steps U03 and U04, after the cleaning solution or the replacement solution is charged, the solution is drained and next liquid (e.g., the replacement solution when the treatment solution is used) is charged. Such is adoptable.

As in Embodiments 1 and 2, the simplified liquid draining operation allows easy replacement of the resist solution A, for example, within the treatment solution supplying device 11 by the replacement solution. This achieves reduction in amount of usage of the replacement solution and the cleaning solution, or omission of Step U02. When the treatment solution supplying device 11 or 61, or the substrate treating apparatus 1 is to be shipped, Steps U01 to U03 are performed and thereafter Steps S01 and S02 or Steps S11 and 12 are performed for liquid draining. Then, the liquid/gas supplying unit 7 may continuously supply the gas for drying the interior of the reservoir 48. During this operation, the on-off valves V2 to V5 are switched to circulate the gas as in Steps S01 and S02.

The present invention is not limited to the foregoing examples, but may be modified as follows.

(1) In Embodiment 1 mentioned above, Steps S01 and S02 may be repeated. Moreover, in Embodiment 2, Steps S11 and S12 may be repeated. In this case, Steps S12, S11, and S12 are performable in this order for the liquid draining. Moreover, Step S11 is performable after Step S12.

(2) As in FIG. 1, the circulation of the treatment solution is controlled in synchronization with the displacement of the diaphragm 43 in the pumping apparatus 25 of Embodiment mentioned above. Accordingly, the first opening 55A and the second opening 55B are used for the normal liquid feed that the treatment solution is sucked into the reservoir 48 through the first opening 55A and the treatment solution in the reservoir 48 is fed out through the second opening 55B. The third opening 55C is used for discharging the treatment solution in the reservoir 48 through the third opening 55C by introducing the pressurized gas through the first opening 55A into the reservoir 48. The second opening 55B for feeding out the treatment solution is higher in level than the first opening 55A for sucking the treatment solution. This achieves removal of air bubbles from the reservoir 48 through the second opening 55B during the normal liquid feed.

In contrast to this, the pumping apparatus 25 of Embodiment 1 illustrated in FIG. 1 has the configuration similar to that of the second pumping apparatus 63 of Embodiment 2 illustrated in FIG. 6. Detailed example is as under. The circulation of the treatment solution is controlled in synchronization with the displacement of the diaphragm 43. Accordingly, the first opening 55A and the third opening 55C are used for the normal liquid feed that the treatment solution is sucked into the reservoir 48 through the first opening 55A and the treatment solution in the reservoir 48 is fed out through the third opening 55C. Moreover, the third opening 55C is used for discharging the treatment solution in the reservoir 48 through the third opening 55C by introducing the pressurized gas through the first opening 55A into the reservoir 48. In such a modification, the nozzle 2 is provided at an end of the pipes (flow path) 27C and 9B connected to the third opening 55C.

Accordingly, the first opening 55A for sucking the treatment solution is lower in level than the second opening 55B. Moreover, the third opening 55C for feeding out the treatment solution is the lowest in level among the three openings (i.e., the first opening 55A, the second opening 55B, and the third opening 55C). Consequently, air bubbles are collected around the second opening 55B. This achieves prevention of air bubbles from feeding out of the reservoir 48 through the third opening 55C during the normal liquid feed.

Moreover, the second opening 55B is used for discharging the air bubbles collected at the upper interior of the reservoir 48 through the second opening 55B. Accordingly, during the normal liquid feed, the liquid is sucked through the first opening 55A lower in level than the second opening 55B. Moreover, the liquid is fed out through the third opening 55C lowest in level among the three openings 55A to 55C. In this case, the air bubbles collected around the second opening 55B is able to be discharged through the second opening 55B. Thereafter, the air bubbles may be trapped in the filter 23. The trapped air bubbles may be discharged through the exhaust pipe 30.

This modification may be configured as under. Any two of the three openings are used normal liquid feed of sucking the treatment solution into the reservoir 48 and feeding out the treatment solution within the reservoir 48 by controlling circulation of the treatment solution in synchronization with the displacement of the diaphragm 43. Moreover, the third opening 55C is used for discharging the treatment solution within the reservoir 48 by introducing the pressurized gas through at least one of the two openings 55A and 55B into the reservoir 48.

Figure 12A:
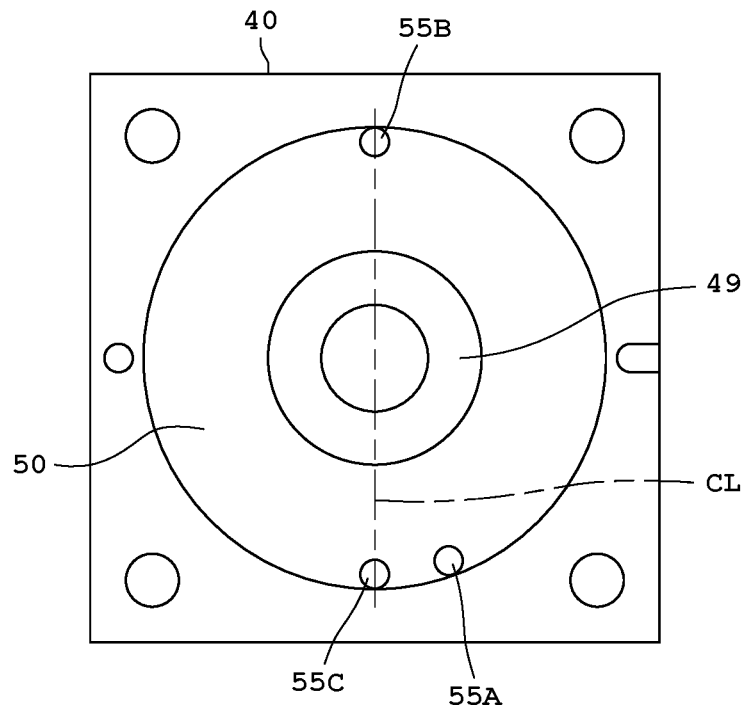
FIGS. 12A and 12B are each a modification of the pumping apparatus.

(3) In the embodiments and the modifications mentioned above, the third opening 55C is provided at almost the lowest position in level in the reservoir 48 (in the chamber body 40) and at a position equal in level to the first opening 55A, as illustrated in FIGS. 3 and 7B. In contrast to this, the third opening 55C may be disposed lower in level than the first opening 55A. For instance, the third opening 55C may be disposed at the lowest position in level in the reservoir 48, as illustrated in FIG. 12A. That is, the third opening 55B is provided on a longitudinal center line CL passing the center of the reservoir 48. The second chamber body 65 includes the third opening 71C similar to the third opening 55C provided in the first chamber body 40.

Figure 12B:
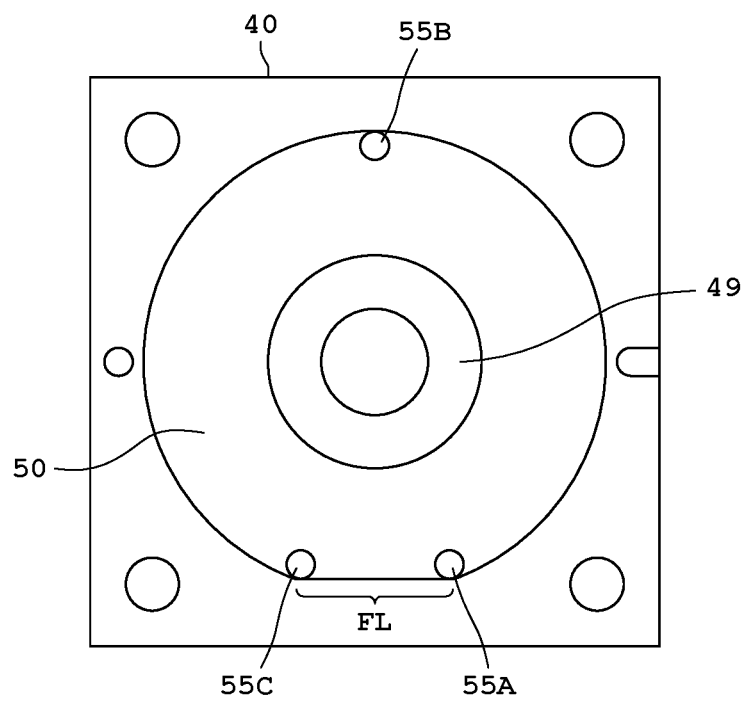

Moreover, as illustrated in FIGS. 3 and 7B, the third opening 55C is disposed at almost the lowest position in the reservoir 48. In contrast to this, the reservoir 48 may be formed such that the first opening 55A and the third opening 55C are disposed at the lowest position in level in the reservoir 48. For instance, a flat plane FL may be a contact portion of the third opening 55C and the first opening 55A in FIG. 12B.

It is assumed in this case that no projection that prevents flow from the first opening 55A to the third opening 55C is formed between the first opening 55A and the third opening 55C in the reservoir 48.

(4) In the embodiments and the modifications mentioned above, the treatment solution supplying device 11 and 61 are formed separately from the nozzle 2, the pipes 9A and 9B, and the liquid/gas supplying unit 7. In contrast to this, the treatment solution supplying device 11, 61 may include at least any of the nozzle 2, the pipes 9A, 9B, and the liquid/gas supplying unit 7.

(5) In the embodiments and the modifications mentioned above, the liquid/gas supplying unit 7 as the gas supplying unit supplies the gas from the gas supplying source 17 via the empty container to the treatment solution supplying device 11, 61. In contrast to this, the liquid supplying unit 7 may supply the gas from the gas supplying source 17 to the treatment solution supplying device 11 and 61 without through the empty container. For instance, the gas may be supplied directly to the pipes 27A, 75A or the pipe 27B.

(6) In the above embodiments and the modifications mentioned above, the diaphragms 43 and 73 and the guide pins 41 and 72 are at rest during the liquid draining operation. In contrast to this, the diaphragms 43 and 73 and the guide pins 41 and 72 may move during the liquid draining operation.

(7) In the above embodiments and the modifications mentioned above, the first pumping apparatus 15 includes the first opening 55A, the second opening 55B, and the third opening 55C, whereas the second pumping apparatus 63 includes the first opening 71A, the second opening 71B, and the third opening 71C. That is, the first pumping apparatus 25 and the second pumping apparatus 63 each include the three openings. Alternatively, the first pumping apparatus 25 and the second pumping apparatus 63 may each further include one opening or two or more openings for feeding into/out the treatment solution.

(8) In the embodiments and the modifications mentioned above, the third opening 55C, 71C is provided around the bottom of the reservoir 48. Alternatively, the third opening 55C, 71C may be provided not around the bottom of the reservoir 48 but on a position higher in level than the bottom of the reservoir 48. That is, as for the pumping apparatus 25, the third opening 55C may be disposed at the lowest position among the three openings 55A to 55C. Specifically, the third opening 55C is disposed lower in level than the second opening 55B and equal to or below the first opening 55A. The second pumping apparatus 63 has the same configuration as the first pumping apparatus 25.

Figure 13:
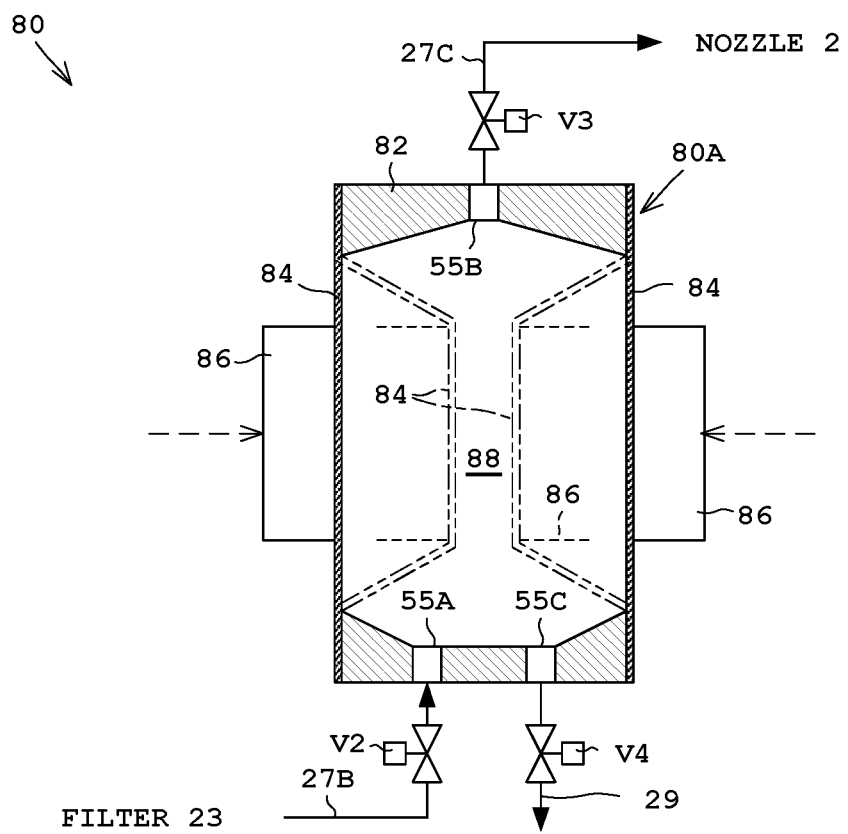
FIG. 13 is a modification of the pumping apparatus.

(9) Instead of combination of the chamber 40, 65 and the diaphragms 43, 75 in the embodiments and the modifications mentioned above, an elastic tubular member 84 as in FIG. 13 may be used. The following describes this modification. The pumping apparatus 80 includes a pump body 80A, and on-off valves V2 to V4. The pump body 80A includes the chamber body 82, the tubular member 84, a drive mechanism 86, the first opening 55A, the second opening 55B, and the third opening 55C. Here, the on-off valves V2 to V4, the first opening 55A, the second opening 55B, and the third opening 55C are each represented by the same numerals of the elements in the pumping apparatus 25 of Embodiment 1, respectively.

The tubular member 84 surrounds the reservoir 88 (within the chamber body 82). The tubular member 84 contacts the reservoir 88. The drive mechanism 86 causes the body of the tubular member 84 to be displaced, whereby a volume of the reservoir 88 is changed. When the movable part is the tubular member 84, the treatment solution stored in the reservoir 88 is able to be drained more easily. The drive mechanism 86 is not necessarily moved by the motor M1, but may use hydraulic pressure or air pressure to deform the tubular member 84.

(10) In the embodiments and the modifications mentioned above, the gas supplying source 17 of the liquid/gas supplying unit 17 in FIG. 1 supplies the gas during the liquid draining. Alternatively, the gas may be introduced into the reservoir 48, 74 by operation of the treatment solution supplying device 11, 61 as in the normal liquid feed mentioned above. In this case, the treatment solution container 15 is replaced by an empty container with no treatment solution. The empty container may be the container from which the treatment solution is fed out to be empty. Alternatively, outside air may freely enter into the empty container, or the gas may be supplied into the empty container from the gas supplying source 17. Alternatively, in the treatment solution supplying device 61 of Embodiment 2 in FIG. 6, the two diaphragms 43, 73 may cooperate to introduce the gas into the reservoir 48, 74. Instead of this, one of the two diaphragms 43, 73 may operate. For instance, during the liquid draining in Step S11 in FIG. 9, the diaphragm 43 does not operate but the diaphragm 73 operates. In this case, suction and feeding out by the on-off valves V14, V16 and the diaphragm 73 is performed while the on-off valves V12, V13, V15 close and the on-off valve V11 opens. This achieves the liquid draining.

The present invention may be embodied in other specific forms without departing from the spirit or essential attributes thereof and, accordingly, reference should be made to the appended claims, rather than to the foregoing specification, as indicating the scope of the invention.

What is claimed is:

1. A pumping apparatus for feeding a liquid, the pumping apparatus comprising:
   a chamber with a reservoir as an interior space that stores the liquid and a movable part that contacts the reservoir, a volume of the reservoir being changed by displacement of the movable part; and
   a drive unit that displaces the movable part;
   the chamber having at least three openings, or a first opening, a second opening, and a third opening formed therein that are in communication with the reservoir,
   the second opening being higher in level than the first opening,
   the third opening being at a lowest level with respect to the reservoir and being positioned along an outer edge of the movable part,
   any two of the three openings being used for normal liquid feed of sucking the liquid into the reservoir and feeding out the liquid from the reservoir by controlling circulation of the liquid in synchronization with the displacement of the movable part,
   the reservoir of the chamber being formed in a truncated cone shape having a vertical face and a slope face, the slope face being connected to a circle whose diameter is larger than a diameter of the vertical face,
   the third opening being provided on a lower slope face of the slope face,
   the movable part and the slope face being provided so as to sandwich the circle, and
   the third opening being used for dispensing the liquid within the reservoir guided along the slope face and the outer edge of the movable part by introducing gas through at least one of the first opening and the second opening into the reservoir.

2. The pumping apparatus according to claim 1, wherein the first opening and the third opening are both at the lowest level with respect to the reservoir.

3. The pumping apparatus according to claim 1, wherein the first opening and the second opening are used for normal liquid feed of sucking the liquid into the reservoir through the first opening and feeding out the liquid within the reservoir through the second opening by controlling circulation of the liquid in synchronization with the displacement of the movable part, and
   the third opening is used for discharging the liquid within the reservoir by introducing gas through the first opening into the reservoir.

4. The pumping apparatus according to claim 1, wherein the first opening and the third opening are used for normal liquid feed of sucking the liquid into the reservoir through the first opening and feeding out the liquid within the reservoir through the third opening by controlling circulation of the liquid in synchronization with the displacement of the movable part, and
   the third opening is used for discharging the liquid within the reservoir by introducing gas through the first opening into the reservoir.

5. The pumping apparatus according to claim 4, wherein the second opening is used for discharging air bubbles collected at an upper portion of the reservoir.

6. The pumping apparatus according to claim 1, wherein the movable part is a diaphragm for contacting the reservoir, and
   the drive unit displaces the diaphragm.

* * * * *